(12) United States Patent
Smith et al.

(10) Patent No.: US 11,476,408 B2
(45) Date of Patent: Oct. 18, 2022

(54) SPIN ORBIT TORQUE (SOT) MEMORY DEVICES WITH ENHANCED MAGNETIC ANISOTROPY AND METHODS OF FABRICATION

(71) Applicant: Intel Corporation, Santa Clara, CA (US)

(72) Inventors: Angeline Smith, Hillsboro, OR (US); Sasikanth Manipatruni, Portland, OR (US); Christopher Wiegand, Portland, OR (US); Tofizur Rahman, Portland, OR (US); Noriyuki Sato, Hillsboro, OR (US); Benjamin Buford, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 862 days.

(21) Appl. No.: 16/144,978

(22) Filed: Sep. 27, 2018

(65) Prior Publication Data
US 2020/0105998 A1  Apr. 2, 2020

(51) Int. Cl.
| | |
|---|---|
| *H01L 43/02* | (2006.01) |
| *H01L 43/12* | (2006.01) |
| *H01L 43/08* | (2006.01) |
| *H01L 27/22* | (2006.01) |
| *H01L 43/10* | (2006.01) |
| *G11C 11/16* | (2006.01) |

(52) U.S. Cl.
CPC .............. *H01L 43/02* (2013.01); *H01L 27/22* (2013.01); *H01L 43/08* (2013.01); *H01L 43/10* (2013.01); *H01L 43/12* (2013.01); *G11C 11/161* (2013.01)

(58) Field of Classification Search
CPC ......... H01L 27/22; H01L 48/08; H01L 48/10; H01L 48/12
See application file for complete search history.

(56) References Cited

U.S. PATENT DOCUMENTS

| | | | |
|---|---|---|---|
| 2018/0123027 A1* | 5/2018 | Yamane | H01L 43/08 |
| 2018/0248114 A1* | 8/2018 | Oguz | H01F 10/3286 |
| 2020/0273864 A1 | 8/2020 | Manipatruni et al. | |
| 2020/0273866 A1 | 8/2020 | Manipatruni et al. | |
| 2020/0273867 A1 | 8/2020 | Manipatruni et al. | |
| 2020/0303343 A1 | 9/2020 | Manipatruni et al. | |
| 2020/0303344 A1 | 9/2020 | Manipatruni et al. | |
| 2020/0321344 A1 | 10/2020 | Ramamoorthy et al. | |
| 2020/0321472 A1 | 10/2020 | Ramamoorthy et al. | |
| 2020/0321473 A1 | 10/2020 | Ramamoorthy et al. | |
| 2020/0321474 A1 | 10/2020 | Ramamoorthy et al. | |
| 2021/0202507 A1 | 7/2021 | Thareja et al. | |
| 2021/0202510 A1 | 7/2021 | Thareja et al. | |
| 2021/0202689 A1 | 7/2021 | Thareja et al. | |
| 2021/0202690 A1 | 7/2021 | Thareja et al. | |
| 2021/0203324 A1 | 7/2021 | Manipatruni et al. | |

(Continued)

*Primary Examiner* — Trang Q Tran
(74) *Attorney, Agent, or Firm* — Essential Patents Group, LLP

(57) ABSTRACT

A perpendicular spin orbit torque (SOT) memory device includes an electrode having a spin orbit coupling material and a perpendicular magnetic tunnel junction (pMTJ) device on a portion of the electrode. The pMTJ device includes a free magnet, a fixed magnet and a tunnel barrier layer in between, where at least one of the fixed magnet or the free magnet includes two magnetic layers and a spacer layer comprising tungsten in between.

20 Claims, 13 Drawing Sheets

(56) References Cited

U.S. PATENT DOCUMENTS

| | | |
|---|---|---|
| 2021/0203325 A1 | 7/2021 | Manipatruni et al. |
| 2021/0203326 A1 | 7/2021 | Manipatruni et al. |
| 2021/0226636 A1 | 7/2021 | Manipatruni et al. |

* cited by examiner

SPIN ORBIT TORQUE (SOT) MEMORY DEVICES WITH ENHANCED MAGNETIC ANISOTROPY AND METHODS OF FABRICATION

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely on innovative devices such as spin orbit torque (SOT) memory devices including a spin orbit torque electrode coupled with a compatible MTJ device to overcome the requirements imposed by scaling.

Non-volatile embedded memory with SOT memory devices, e.g., on-chip embedded memory with non-volatility can enable energy and computational efficiency. However, the technical challenges of assembling a material layer stack to form functional SOT memory devices present formidable roadblocks to commercialization of this technology today. Specifically, increasing thermal stability in SOT memory devices are some important areas of device development.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF THE EMBODIMENTS

Figure 1A:
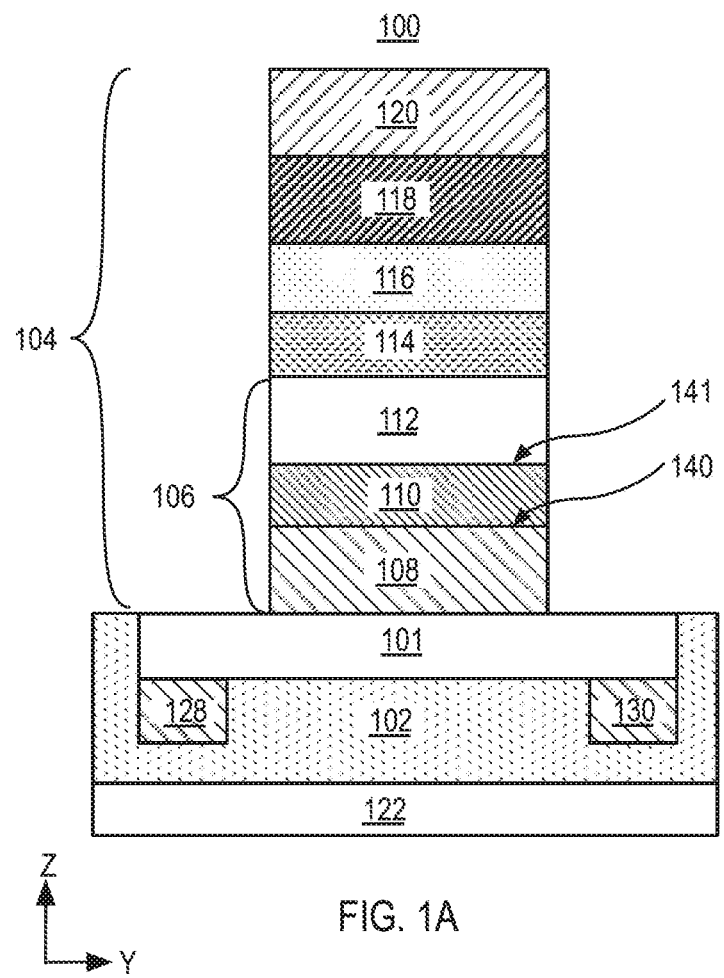
FIG. 1A illustrates a cross-sectional view of a spin orbit torque (SOT) memory device with a composite free magnetic structure, in accordance with an embodiment of the present disclosure.

Spin orbit torque (SOT) memory devices with enhanced magnetic anisotropy and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

A SOT memory device may include a magnetic tunnel junction (MTJ) device formed on a spin orbit torque electrode. The MTJ device functions as a memory device where the resistance of the MTJ device switches between a high resistance state and a low resistance state. The resistance state of an MTJ device is defined by the relative orientation of magnetization between a free magnet and a fixed magnet that are separated by a tunnel barrier. When the magnetization of the free magnet and a fixed magnet have orientations that are in the same direction, the MTJ device is said to be in a low resistance state. Conversely, when the magnetization of the free magnet and a fixed magnet each have orientations that are in opposite direction to each other, the MTJ device is said to be in a high resistance state.

In an embodiment, in an absence of a spin orbit torque electrode, resistance switching in an MTJ device is brought about by passing a critical amount of spin polarized current through the MTJ device so as to influence the orientation of the magnetization of the free magnet to align with the magnetization of the fixed magnet. The act of influencing the magnetization is brought about by a phenomenon known as spin torque transfer, where the torque from the spin polarized current is imparted to the magnetization of the free magnet. By changing the direction of the current, the direction of magnetization in the free magnet may be reversed relative to the direction of magnetization in the fixed magnet. Since the free magnet does not need a constant source of spin polarized current to maintain a magnetization direction, the resistance state of the MTJ device is retained even when there is no current flowing through the MTJ device. For this reason, the MTJ device belongs to a class of memory known as non-volatile memory.

As an MTJ device is scaled down in size, the amount of critical spin polarized current density required to switch the device increases. By implementing an MTJ device on a SOT electrode, the magnetization in the free magnet may undergo torque assisted switching from a Spin Hall current, induced by passing an electrical current through the SOT electrode in a direction transverse to a thickness of the MTJ device material stack. The Spin Hall current arises from spin dependent scattering of electrons due to a phenomenon known as spin orbit interaction. Electrons of one spin polarity are directed towards an upper portion of the spin orbit torque electrode and electrons with an opposite spin polarity are directed toward a bottom portion of the spin orbit torque electrode. Electrons of a particular spin polarity are directed toward the MTJ device and impart a spin orbit torque on the magnetization of the free magnet that is typically in contact with the SOT electrode. The spin hall current may also help the MTJ device switch faster. It is to be appreciated that, in an embodiment, the spin hall current can fully switch a free magnet having a magnetization that is oriented in an in-plane direction. An in-plane direction is defined as a direction that is parallel to an uppermost surface of the spin orbit torque electrode. An external field may be utilized to exert a torque to completely switch the perpendicular free magnet from an in-plane direction.

As MTJ devices (formed on spin orbit torque electrode) are scaled, the need for smaller memory cell size has driven the industry in the direction of an SOT memory device based on a perpendicular MTJ (pMTJ). A pMTJ formed on an SOT electrode may be known as a pSOT memory device. The fixed magnet and the free magnet of the pMTJ memory device have magnetic anisotropy that are perpendicular with respect to a plane defining an uppermost surface of the spin orbit torque electrode.

Integrating a non-volatile memory device such as an pSOT memory device onto access transistors enables the formation of embedded memory for system on chip (SOC) applications. However, approaches to integrate a pSOT memory device onto access transistors presents challenges that have become far more formidable with scaling. One such challenge is the need to improve magnetic anisotropy of the free magnet and the fixed magnet of the pSOT memory device. Magnetic anisotropy of the free magnet may be improved by increasing a thickness of the free magnet. However, increasing the thickness alone may cause a magnet that has a perpendicular magnetic anisotropy to become in plane. An alternative scheme is to insert one or more spacer layers between at least two layers in a free magnetic structure to increase interfacial magnetic anisotropy (a component of the total magnetic anisotropy of free or fixed magnets). The spacer layers may be conductive but have a wide variety of electrical resistances. Some spacer layers may be purely metallic while others may include oxygen and a metal. Since the free magnetic layer in a pSOT device is in contact with the SOT electrode, it is advantageous for efficient magnetic switching when the spacer layer is a conductor (for e.g., a metal such as tungsten).

Inserting one or more spacer layers between at least two layers in a fixed magnetic structure may also increase the magnetic anisotropy of the fixed magnet. The increase in magnetic anisotropy is caused by an increase in interfacial magnetic anisotropy.

In addition to providing an increase in perpendicular magnetic anisotropy, a spacer layer that includes predominantly tungsten or substantially pure (elemental) tungsten also acts as a diffusion barrier to prevent diffusion of elements in the pMTJ device during various operations in the fabrication process. A metal such as tungsten has a high melting point and a high density, such that when a pMTJ device is annealed at high temperatures, such as above 350 degrees, the tungsten metal may act as a diffusion barrier. The tungsten metal may prevent diffusion of elemental iron from a free magnet in contact with a tunnel barrier and help preserve properties of the pMTJ device such as tunneling magnetoresistance ratio and switching speed. In some embodiments, the presence of a substantially pure (elemental) tungsten spacer layer that may act as a texture breaker in the fixed magnet and may help improve the crystallinity of both the fixed magnet and a synthetic antiferromagnet structure that is magnetically coupled to the fixed magnet. Improving crystallinity in the fixed magnet and in the synthetic antiferromagnet structure may also allow for improvement in the perpendicular magnetic anisotropy of the pMTJ device.

In accordance with embodiments of the present disclosure, a spin orbit torque (SOT) memory device includes a first electrode including a spin orbit torque material and a perpendicular magnetic tunnel junction (pMTJ) device coupled with the first electrode. In an embodiment, the first electrode has uppermost surface area that is 10 to 20 times larger than a lowermost surface area of the pMTJ device. The pMTJ device includes a free magnet, a fixed magnet above the free magnet, where at least one of the free magnet or the fixed magnet includes two magnetic layers and a spacer including a material such as tungsten between the two magnetic layers. The pMTJ device further includes a tunnel barrier between the fixed magnet and the free magnet and a second electrode coupled with the fixed magnet.

In one embodiment, the free magnet structure includes a first and a second magnetic layer and a first spacer layer including a material such as tungsten between the first and the second magnetic layers. In one such embodiment, the pMTJ includes a fixed magnet structure that has a third and a fourth magnetic layer and a second spacer layer including a material such as tungsten between the third and the fourth magnetic layers.

FIG. 1A is an illustration of a cross-sectional view of a SOT memory device 100 in accordance with an embodiment of the present disclosure. The SOT memory device 100 includes an electrode 101 having a spin orbit torque material, and a material layer stack for a magnetic tunnel junction (MTJ) device 104 on the electrode 101. In some embodiments, such as in the illustrative embodiment, the magnetic tunnel junction (MTJ) device 104 is a perpendicular MTJ (pMTJ) device 104. A pSOT memory device 100 that includes a pMTJ device 104, is herein referred to as a perpendicular SOT (pSOT) memory device 100

In the illustrative embodiment, the material layer stack for a pMTJ device 104 includes a free magnet structure 106. The free magnet structure 106 includes a free magnet 108 on the electrode 101, a free magnet 112 above the free magnet 108 and a spacer layer 110 including predominantly tungsten between the free magnet 108 and the free magnet 112. The pMTJ device 104 further includes a tunnel barrier 114 on the free magnet 112, and a fixed magnet 116 on the tunnel barrier 114. In the illustrative embodiment, the presence of the spacer layer 110 leads to interfaces 140 and 141 between the free magnet 108 and the free magnet 112. The interface 140 between the free magnet 108 and the spacer layer 110 and the interface 141 between the spacer layer 110 and the free magnet 112 may advantageously increase interfacial magnetic anisotropy of the free magnet structure 106. An increase in the increase interfacial magnetic anisotropy may improve the overall perpendicular magnetic anisotropy of the pMTJ device 104. Increasing perpendicular magnetic anisotropy may help to efficiently switch the resistance state of the pMTJ device 104 from a low to a high resistance state and vice versa. The spacer layer 110 electrically couples the free magnet 108 to free magnet 112 so that the spin diffusion current may be transmitted from free magnet 108 to free magnet 112. In an embodiment, the spacer layer 110 has a thickness between 0.05 nm and 0.3 nm. A thickness between 0.05 nm and 0.3 nm may permit a spin diffusion current to pass through with no observable impact to switching efficiency.

Depending on embodiments, the free magnet 108 and free magnet 112 may each have a thickness that is the same, substantially the same, or different. In one example, the free magnet 108 may have a thickness between 0.5 nm and 2.0 nm and the free magnet 112 may have a thickness between 0.5 nm and 2.0 nm for pMTJ devices. In other embodiments, the free magnet 108 has a thickness that is greater than a thickness of the free magnet 112. For example, free magnet 108 may have a thickness between 0.9 nm and 2.5 nm, and free magnet 112 may have a thickness between 0.5 nm and 2.0 nm. In one embodiment, the free magnet 108 and the free magnet 112 have a combined total thickness that is less than 5 nm.

In an embodiment, the free magnet 108 includes a magnetic material such as Co, Ni, Fe or alloys of these materials. In an embodiment, the free magnet 108 includes a magnetic material such as CoB, FeB, CoFe or CoFeB. In some embodiments, the free magnet 108 includes a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the free magnet 108 is FeB, where the concentration of boron is between 10 and 40 atomic percent of the total composition of the FeB alloy. In an embodiment, the free magnet 112 includes a magnetic material such as Co, Ni, Fe or alloys of these materials. In an embodiment, the free magnet 112 includes a magnetic material such as CoB, FeB, CoFe or CoFeB. In some embodiments, the free magnet 112 includes a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the free magnet 112 is FeB, where the concentration of boron is between 10 and 40 atomic percent of the total composition of the FeB alloy. In an embodiment, the free magnet 108 and the free magnet 112 include $Co_{100-x-y}Fe_xB_y$, where X and Y each represent atomic percent, further where X is between 50 and 80 and Y is between 10 and 40, and further where the sum of X and Y is less than 100.

In an embodiment, the free magnet 108 has a perpendicular magnetic anisotropy that is greater than a perpendicular magnetic anisotropy of the free magnet 112 to promote efficient switching. The relative perpendicular magnetic anisotropy of the free magnet 108 and of the free magnet 112 may be tuned by selecting a choice of material having a desired thickness from the choices described above.

The electrode 101 includes a metal with high degree of spin orbit coupling. A metal with a high degree of spin-orbit coupling has an ability to inject a large spin polarized current in to the free magnet structure 106. A large spin polarized current can exert a large amount of torque and influence the magnetization of the free magnet structure 106 for faster switching. In an embodiment, the electrode 101 includes a metal such as but not limited to tantalum, tungsten, platinum or gadolinium, β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. Layers of 2D materials of $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$. An electrode 101 including a beta phase tantalum or beta phase tungsten has a high spin hall efficiency. With a high spin hall efficiency, the electrode 101 can generate a large spin hall current for a given charge current that is passed through the electrode 101. In an embodiment, the electrode 101 has thickness of between 2 nm-20 nm.

In an embodiment, tunnel barrier 114 includes a material suitable for allowing electron current having a majority spin to pass through tunnel barrier 114, while impeding, at least to some extent, electron current having a minority spin from passing through tunnel barrier 114. Thus, tunnel barrier 114 (or spin filter layer) may also be referred to as a tunneling layer for electron current of a particular spin orientation. In an embodiment, tunnel barrier 114 includes a material such as, but not limited to, oxygen and at least one of magnesium (e.g., a magnesium oxide, or MgO), or aluminum (e.g., an aluminum oxide such as $Al_2O_3$). In an embodiment, tunnel barrier 114 including MgO has a crystal orientation that is (001) and is lattice matched to free magnet 112 below tunnel barrier 114 and fixed magnet 116 above tunnel barrier 114. In an embodiment, tunnel barrier 114 is MgO and has a thickness in the range of 1 nm to 3 nm. In an embodiment, a free magnet 112 including a $Co_{100-x-y}Fe_xB_y$, is highly lattice matched to the tunnel barrier 114 including an MgO. Lattice matching a crystal structure of the free magnet 112 with the tunnel barrier 114 enables a higher tunneling magnetoresistance (TMR) ratio in the pMTJ device 104.

In some embodiments, the fixed magnet 116 includes a material and has a thickness sufficient for maintaining a fixed magnetization. In an embodiment, the fixed magnet 116 of the pMTJ device 104 includes an alloy such as CoFe or CoFeB. In an embodiment, the fixed magnet 116 comprises a $Co_{100-x-y}Fe_xB_y$, where X and Y each represent atomic percent, further where X is between 50-80 and Y is between 10 and 40, and further where the sum of X and Y is less than 100. In one specific embodiment, X is 60 and Y is 20. In an embodiment, the fixed magnet 116 is FeB, where the concentration of boron is between 10 and 40 atomic percent of the total composition of the FeB alloy. In an embodiment the fixed magnet 116 has a thickness that is between 1 nm and 3 nm.

Figure 1B:
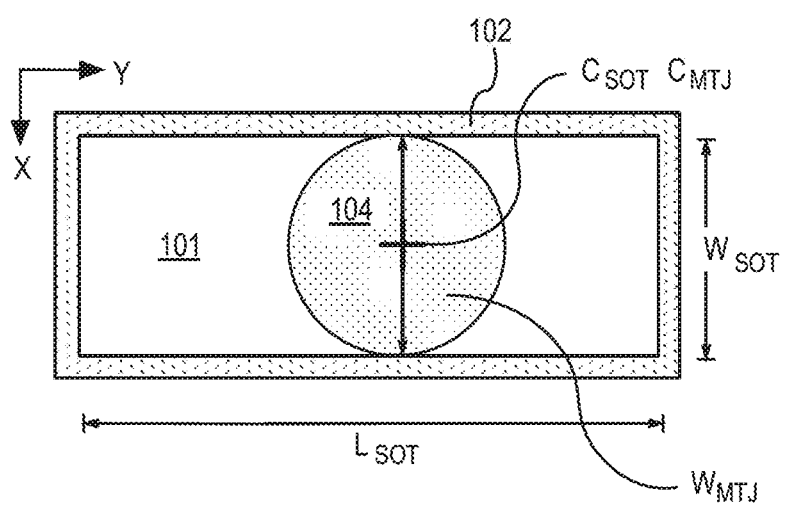
FIG. 1B illustrates a plan view of a magnetic tunnel junction (MTJ) device on a spin orbit torque electrode, in accordance with an embodiment of the present disclosure.

In an embodiment, the electrode 101 has a rectangular plan view profile and the pMTJ device 104 has a circular plan view profile as illustrated in FIG. 1B. In another embodiment, the pMTJ device 104 has a plan view profile that is rectangular or elliptical. In an embodiment, the electrode 101 has a length, LsoT, between 100 nm and 500 nm. In an embodiment, the electrode 101 has a thickness between 2 nm and 10 nm. In an embodiment, the electrode 101 has a width, $W_{SOT}$, between 10 nm and 50 nm. In an embodiment, the pMTJ device 104 has a broadest cross-sectional width, $W_{MTJ}$, that is similar or substantially similar to the width, $W_{SOT}$. In an embodiment, the pMTJ device 104 has a broadest cross-sectional width, $W_{MTJ}$, that is between 10 nm and 50 nm.

In an embodiment, the pMTJ device 104 has a center, $C_{MTJ}$ and the electrode 101 has a center, $C_{SOT}$, as illustrated in the plan view illustration of FIG. 1B. In an embodiment, $C_{MTJ}$ is aligned to $C_{SOT}$ in X and Y directions, as illustrated. In another embodiment, $C_{MTJ}$ is misaligned from the $C_{SOT}$ in the Y-direction. Misalignment may range between 10 nm and 30 nm. The electrical resistivity of the electrode 101 may play a role in positioning of the pMTJ device 104 on the electrode 101 along the Y-direction in FIG. 1B.

Figure 1C:
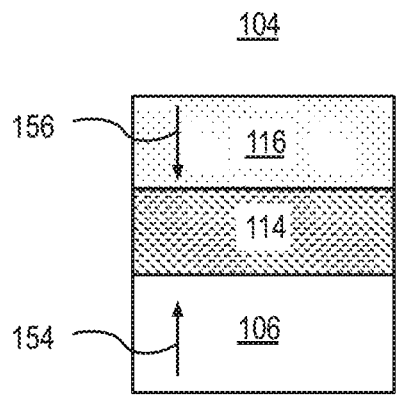
FIG. 1C illustrates a cross-sectional view depicting the direction of magnetization in a free magnet relative to the direction of magnetization in a fixed magnetic layer, in accordance with an embodiment of the present disclosure.

FIG. 1C illustrates a cross-sectional view depicting the free magnet structure 106 of the pMTJ device 104 having a direction of magnetization (denoted by the direction of the arrow 154) that is anti-parallel to a direction of magnetization (denoted by the direction of the arrow 156) in the fixed magnet 116. When the direction of magnetization 154 in the free magnet structure 106 is opposite (anti-parallel) to the direction of magnetization 156 in the fixed magnet 116, the pMTJ device 104 device is said to be in a high resistance state.

Figure 1D:
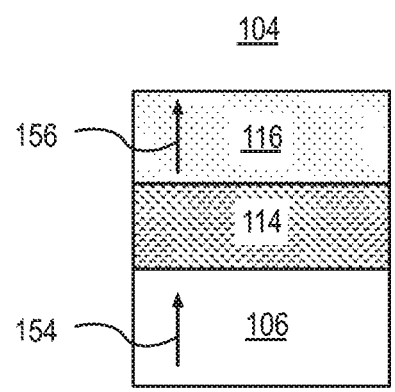
FIG. 1D illustrates a cross-sectional view depicting the direction of magnetization in a free magnet relative to the direction of magnetization in a fixed magnetic layer, in accordance with an embodiment of the present disclosure.

Conversely, FIG. 1D illustrates a cross-sectional view depicting the free magnet structure 106 of the pMTJ device 104 having a direction of magnetization (denoted by the direction of the arrow 154) that is parallel to a direction of magnetization (denoted by the direction of the arrow 156) in the fixed magnet 116. When the direction of magnetization 154 in the free magnet structure 106 is parallel to the direction of magnetization 156 in the fixed magnet 116, the pMTJ device 104 is said to be in a low resistance state.

In an embodiment, the free magnet structure 106 and the fixed magnet 116 can have approximately similar thicknesses. Injected spin polarized current that changes the direction of the magnetization 154 in the free magnet structure 106 can also affect the magnetization 156 of the fixed magnet 116. In an embodiment, to make the fixed magnet 116 more resistant to accidental flipping, the fixed magnet 116 has a higher magnetic anisotropy than the free magnet structure 106. In another embodiment, the pSOT memory device 104 includes a synthetic antiferromagnetic (SAF) structure 118 above the fixed magnet 116 to deter accidental flipping of the magnetization 156 in the fixed magnet 116 as illustrated in FIG. 1A.

Figure 1E:
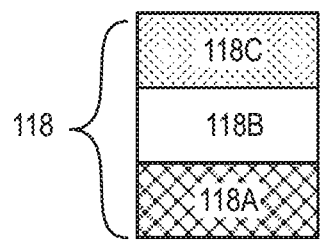
FIG. 1E illustrates a cross-sectional view of individual layers of a synthetic antiferromagnetic structure, in accordance with an embodiment of the present disclosure.

FIG. 1E illustrates cross-sectional view of the SAF structure 118 in an accordance of an embodiment of the present invention. In an embodiment, the SAF structure 118 includes a non-magnetic layer 118B between a first pinning ferromagnet 118A and a second pinning ferromagnet 118C as depicted in FIG. 1D. The first pinning ferromagnet 118A and the second pinning ferromagnet 118C are anti-ferromagnetically coupled to each other. In an embodiment, the first pinning ferromagnet 118A includes a layer of a magnetic metal such as Co, Ni, Fe, alloys such as CoFe, CoFeB, or alloys of magnetic metals such as Co, Ni, Fe or a bilayer of a magnetic/non-magnetic metals such but not limited to Co/Pd or a Co/Pt. In an embodiment, the non-magnetic layer 118B includes a ruthenium or an iridium layer. In an embodiment, the pinning ferromagnet 118C includes a layer of a magnetic metal comprising Fe, Co or Ni. Exemplary alloys include CoFe or CoFeB. Other magnetic alloys of one or more of Co, Ni, Fe are also possible, as is a bilayer structure including a magnetic/non-magnetic metals such but not limited to Co/Pd or a Co/Pt. In an embodiment, a ruthenium based non-magnetic layer 118B has a thickness between 0.3 nm and 1.0 nm to ensure that the coupling between the pinning ferromagnet 118A and the pinning ferromagnet 118C is anti-ferromagnetic in nature.

An additional layer of non-magnetic spacer layer 118A may be between the fixed magnet 116 and the SAF structure 118 (not illustrated in FIG. 1A), which may improve coupling between the SAF structure 118 and the fixed magnet 116. In an embodiment, the non-magnetic spacer layer may include a metal such as Ta, Ru or Ir.

Referring again to FIG. 1A, the pMTJ device 104 further includes a top electrode 120 on the SAF structure 118. In an embodiment, the top electrode 120 includes a material such as Ta or TiN. In an embodiment, the top electrode 120 has a thickness between 5 nm and 70 nm.

The SOT electrode 101 is also electrically coupled with conductive interconnects 128 and 130 to enable transmission of a spin diffusion current during operation of pSOT device 100. In the illustrative embodiment, the conductive interconnect 128 and conductive interconnect 130 are coupled to opposite ends of the SOT electrode 101. In an embodiment, the conductive interconnects 128 and 130 each include a barrier layer, such as tantalum nitride, and a fill metal, such as copper, tungsten or ruthenium.

In other embodiments, (not illustrated) the conductive interconnect 128 couples the SOT electrode 101 from below and the conductive interconnect 130 couples the SOT electrode 101 from above.

In an embodiment, the substrate 122 includes a suitable semiconductor material such as but not limited to, single crystal silicon, polycrystalline silicon and silicon on insulator (SOI). In another embodiment, substrate 122 includes other semiconductor materials such as germanium, silicon germanium or a suitable group III-N or a group III-V compound. Logic devices such as MOSFET transistors and access transistors and may be formed on the substrate 122. Logic devices such as access transistors may be integrated with memory devices such as SOT memory devices to form embedded memory. Embedded memory including SOT memory devices and logic MOSFET transistors may be combined to form functional integrated circuit such as a system on chip.

Figure 2A:
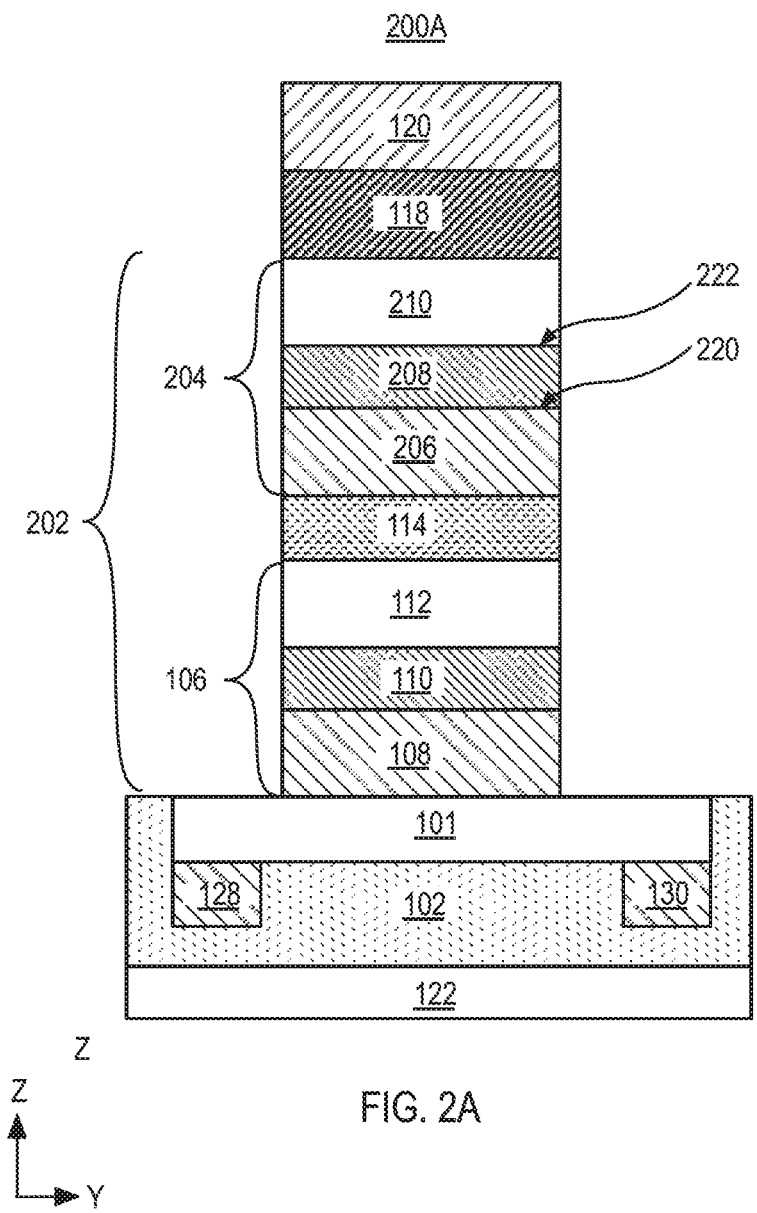
FIG. 2A illustrates a cross-sectional view of a SOT memory device composite fixed magnetic structure above a composite free magnetic structure, in accordance with an embodiment of the present disclosure.

FIG. 2A illustrates a cross-sectional view of a pSOT memory device 200A, including a pMTJ device 200A that includes a spacer layer 208 in a fixed magnet structure. In the illustrative embodiment, the fixed magnet 116 is replaced by a fixed magnet structure 204 in the that includes a fixed magnet 206 above the tunnel barrier 114, a fixed magnet 210 above the fixed magnet 206 and the spacer layer 208 including tungsten between the fixed magnet 210 and the fixed magnet 206. For reasons described above, the spacer layer 208 may be predominantly W in some embodiments. In other embodiments, the spacer layer 208 is substantially pure (elemental) tungsten. The spacer layer 208 electrically couples the fixed magnet 206 to fixed magnet 210 so that a spin polarization current may be transmitted between fixed magnet 210 and fixed magnet 206 (when the pMTJ is voltage biased). The pSOT device 200A includes one or more features of the pSOT device 100 such as electrode 101, free magnet structure 106, SAF structure 118 and top electrode 120.

In the illustrative embodiment, the interface 220 between the fixed magnet 206 and the spacer layer 208 and the interface 222 between the spacer layer 208 and the fixed magnet 210 advantageously increase interfacial magnetic anisotropy of the fixed magnet structure 204. An increase in the increase interfacial magnetic anisotropy may improve the overall perpendicular magnetic anisotropy of the pMTJ device 104. Increasing perpendicular magnetic anisotropy may help to pin the fixed magnet structure 204 and improve thermal stability of the pMTJ device 202. Improving perpendicular magnetic anisotropy of the fixed magnet structure 204 may also improve switch efficiency in the resistance state of the pMTJ device 202 from a low to a high resistance state and vice versa.

When the fixed magnet 206 includes iron and boron, a spacer layer 208 between the fixed magnet 206 and the fixed magnet 210 may also limit diffusion of Fe and B from the fixed magnet 206 to the SAF structure 118. A reduction in diffusion of Fe and B from the fixed magnet 206 may also help to improve the PMA of the SAF structure 118.

In an embodiment, the spacer layer 208 has a thickness between 0.05 nm and 0.3 nm. A thickness between 0.05 nm and 0.3 nm may permit a spin diffusion current to pass through with no observable impact to switching efficiency.

The fixed magnet 206 and fixed magnet 210 may each have a same or substantially the same thickness. For example, the fixed magnet 206 may have a thickness between 0.5 nm and 2.5 nm and the fixed magnet 210 may have a thickness between 0.5 nm and 2.5 nm for pMTJ devices. The fixed magnet 206 may have a thickness that is greater than a thickness of the fixed magnet 210, where, for example, the fixed magnet 206 may have a thickness between 0.9 nm and 2.5 nm and fixed magnet 210 may have a thickness between 0.5 nm and 2.0 nm. The fixed magnet 206 may have a thickness that is less than a thickness of the fixed magnet 210, where, for example, the fixed magnet 206 may have a thickness between 0.5 nm and 2.0 nm. and fixed magnet 210 may have a thickness between 0.9 nm and 2.5 nm. In one embodiment, the fixed magnet 206 and the fixed magnet 210 have a combined total thickness that is less than 5 nm.

In an embodiment, fixed magnet 206 and the fixed magnet 210 each include a material that is substantially the same as the material of the fixed magnet 116 (FIG. 1A). In other embodiments, the fixed magnet 206 includes a different material from the material of the fixed magnet 210.

Figure 2B:
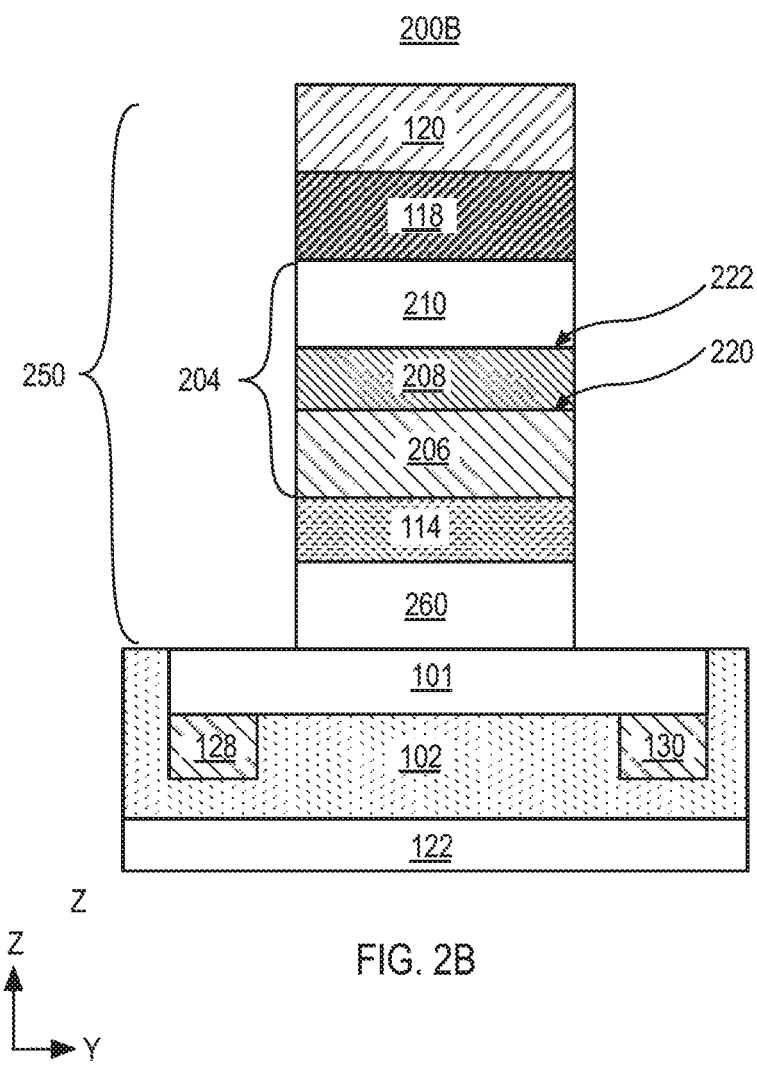
FIG. 2B illustrates a cross-sectional view of a SOT memory device composite fixed magnetic structure, in accordance with an embodiment of the present disclosure.

In a different embodiment, a pSOT device includes a fixed magnet structure including a spacer layer and a single free magnet as illustrated in FIG. 2B. The pSOT device 200B illustrated in FIG. 2B includes a pMTJ device 250 including the fixed magnet structure 204 with a spacer layer 208 including tungsten above a single free magnet 260. In an embodiment, the single free magnet 260 includes a material that is the same or substantially the same as the material of the free magnet 108 or the free magnet 112.

Figure 3A:
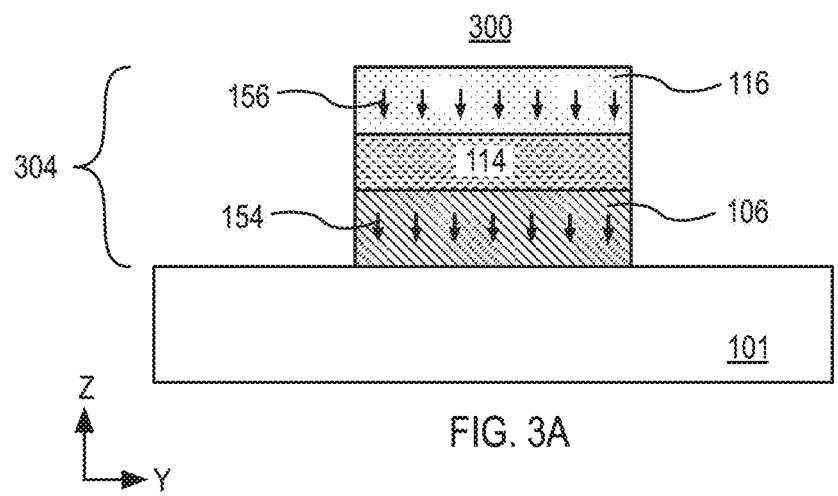
FIG. 3A illustrates a SOT memory device in a low resistance state.
Figure 3B:
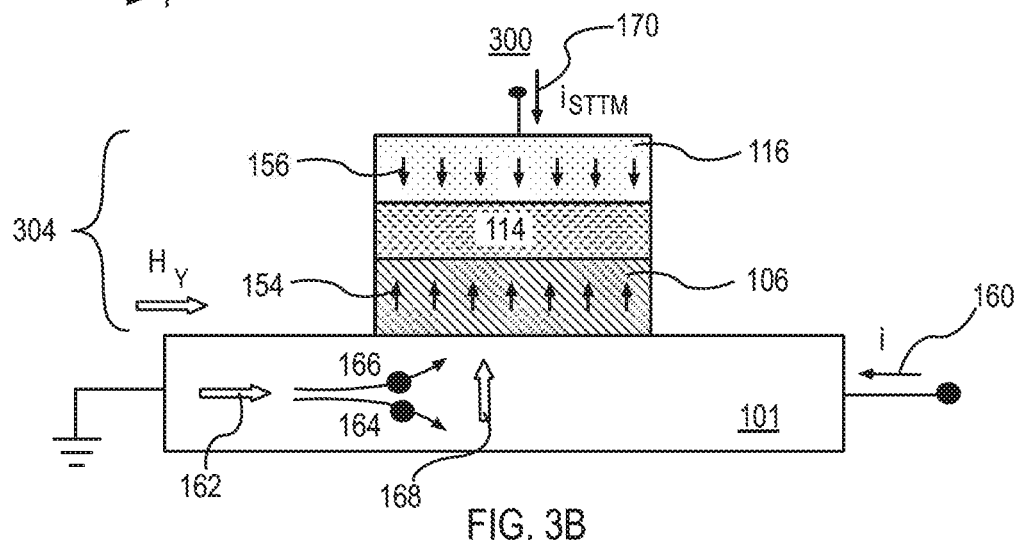
FIG. 3B illustrates a SOT memory device switched to a high resistance state after the application of a spin hall current and an external magnetic field.
Figure 3C:
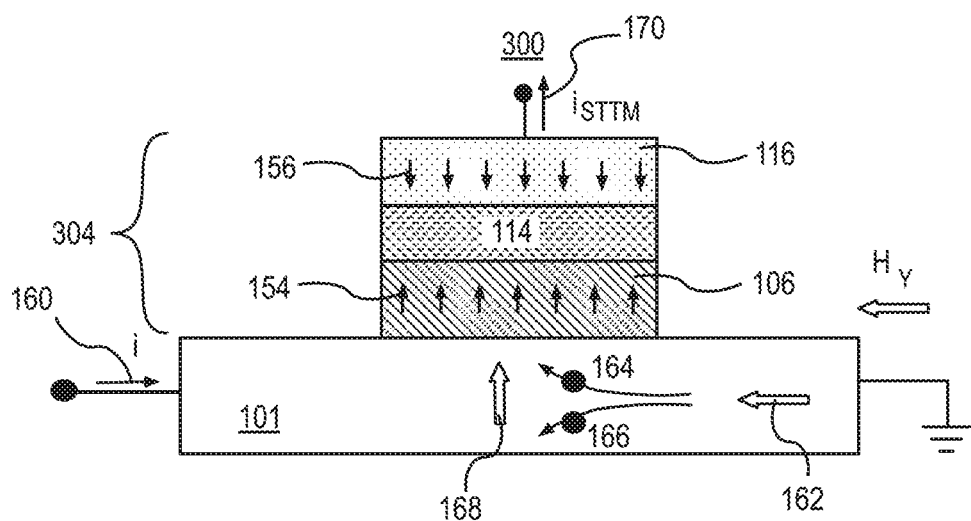
FIG. 3C illustrates a SOT memory device switched to a low resistance state after the application of a spin hall current and an external magnetic field.

FIGS. 3A-3C illustrate a mechanism for switching a spin orbit torque (SOT) memory device such as a spin orbit torque (SOT) memory device 300 including a pMTJ device 304 on the electrode 101 including a spin orbit torque material. In the illustrative embodiment, the pMTJ device 304 includes one or more features of the pMTJ device 104 (FIG. 1A), such as the free magnet structure 106, the fixed magnet 116 and the tunnel barrier 114 between the free magnet structure 106, the fixed magnet 116.

FIG. 3A illustrates a pSOT memory device 300 including the pMTJ device 304 on the electrode 101, where a magnetization 154 of the free magnet structure 106 is aligned in a direction parallel to the magnetization 156 of the fixed magnet 116. In an embodiment, the direction of magnetization 154 of the free magnet structure 106 and the direction of magnetization 156 of the fixed magnet 116 are both in the negative Z-direction as illustrated in FIG. 3A. As discussed above, when the magnetization 154 of the free magnet structure 106 is in the same direction as a magnetization 156 of the fixed magnet 116, pMTJ device 104 (FIG. 1A), is in a low resistance state.

FIG. 3B illustrates the pMTJ device 304 of the spin orbit torque (SOT) memory device 300 switched to a high resistance state. In an embodiment, a reversal in the direction of magnetization 154 of the free magnet structure 106 in FIG. 3B relative to the direction of magnetization 154 of the free magnet structure 106 in FIG. 3A is brought about by (a) inducing a spin diffusion current 168 in the electrode 101 in the Y-direction, (by applying a positive voltage bias on terminal A with respect to a grounded terminal B), and (b) by applying an external magnetic field, $H_y$, in the Y-direction.

In an embodiment, a charge current 160 is passed through the electrode 101 in the negative y-direction. In response to the charge current 160, an electron current 162 flows in the positive y-direction. The electron current 162 includes electrons with two opposing spin orientations, a type I electron 166, having a spin oriented in the negative x-direction and a type II electron 164 having a spin oriented in the positive X-direction. In an embodiment, electrons in the electron current 162 experience a spin dependent scattering phenomenon in the electrode 101. The spin dependent scattering phenomenon is brought about by a spin-orbit interaction between the nucleus of the atoms in the electrode 101 and the electrons in the electron current 162. The spin dependent scattering phenomenon causes type I electrons 166, whose spins are oriented in the negative x-direction (into the page of FIG. 3B), to be deflected upwards towards an uppermost portion of the electrode 101 and type II electrons 164 whose spins are oriented in the positive X-direction to be deflected downwards towards a lowermost portion of the electrode 101. The separation between the type I electrons 166 and the type II electrons 164 induces a polarized spin diffusion current 168 in the electrode 101. In an embodiment, the polarized spin diffusion current 168 is directed upwards toward the free magnet structure 106 of the pMTJ device 104, as is depicted in FIG. 3B. The polarized spin diffusion current 168 induces a Spin Hall torque on the magnetization 154 of the free magnet structure 106. In an embodiment, a torque can also be exerted on the magnetization 154 of the free magnet structure 106 by applying an external magnetic field, $H_y$, in the Y-direction, as illustrated in FIG. 3B. In the illustrative embodiment, the external magnetic field, $H_y$, provides a torque component (in the positive Z direction) to switch the magnetization 154 of the free magnet structure 106.

In an exemplary embodiment, the free magnet structure 106 includes the free magnet 108 and the free magnet 112 separated by spacer layer 110. In such an embodiment, the free magnet 108 experiences Spin Hall torque and undergoes magnetization switching. The free magnet 112 which is dipole coupled with the free magnet 108 and has a magnetic anisotropy that is weaker than a magnetic anisotropy of the free magnet 108, subsequently undergoes magnetization switching.

FIG. 3C illustrates the pMTJ device 304 of the spin orbit torque (SOT) memory device 300 switched to a low resistance state. In an embodiment, a reversal in the direction of magnetization 154 of the free magnet structure 106 in FIG. 3C compared to the direction of magnetization 154 of the free magnet structure 106 in FIG. 3B is brought about by (a) reversal in the direction of the spin diffusion current 168 in the electrode 101 (by applying a positive voltage bias on terminal B with respect to a grounded terminal A), and/or (b) by applying an external magnetic field, $H_y$.

A read operation to determine a state of the MTJ device 104 may be performed by voltage biasing a third terminal C, connected to the fixed magnet 116 with respect to the either terminal and A and B, where the terminals A or B are grounded (not illustrated).

Figure 4:
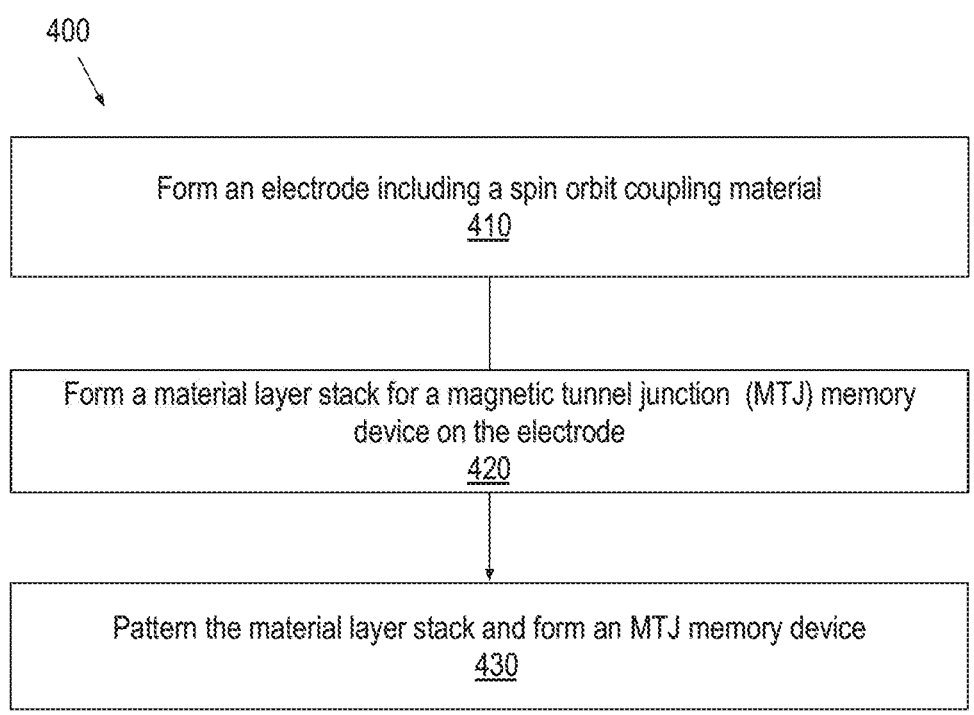
FIG. 4 illustrates a flow diagram for a method to fabricate an SOT device, in accordance with embodiments of the present disclosure.

FIG. 4 illustrates a flow diagram of a method to fabricate a pSOT memory device such as a pSOT memory device 100A. The method 400 begins at operation 410 by forming an electrode including a SOT material in a dielectric layer above a substrate. The method 400 continues at operation 420 with the formation of a material layer stack for the formation of an pMTJ device on the electrode. In exemplary embodiments, all layers in the material layer stack and the second SOT material are blanket deposited in-situ without breaking vacuum. In a simplest embodiment, forming the material layer stack includes a deposition of a free magnetic layer on the second SOT material, deposition of a tunnel barrier layer over the free magnetic layer, deposition of a fixed magnetic layer over the tunnel barrier layer, where deposition of the free magnetic layer or a fixed magnetic layer includes deposition of a first magnetic layer, deposition of a spacer layer on the first magnetic layer and deposition of a second magnetic layer on the spacer layer. In an embodiment, the formation of the material layer stack further includes deposition of a plurality of layers of a synthetic antiferromagnetic (SAF) layer over the fixed magnetic layer, and deposition of a conductive material on the SAF layer.

The method 400 concludes at operation 430 with patterning of the material layer stack to form an MTJ device on the electrode.

FIGS. 5A-5H illustrate cross-sectional views of the pSOT memory device 100 illustrated in FIG. 1A evolving as a fabrication method, such as method 400, is practiced.

Figure 5A:
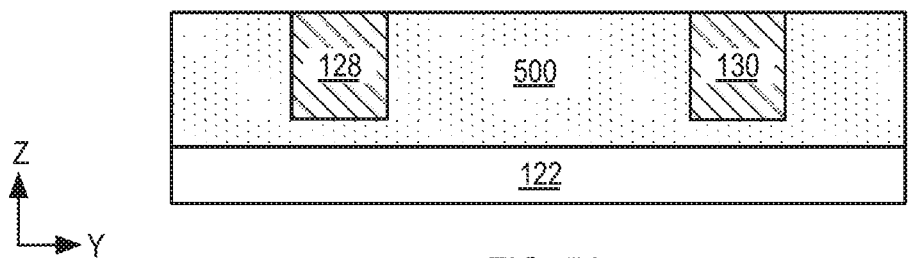
FIG. 5A illustrates a cross-sectional view of the formation of an electrode layer including a spin orbit torque (SOT) material above a pair of conductive interconnects, in an accordance with embodiments of the present disclosure.

FIG. 5A illustrates the structures of conductive interconnects 128 and 130 surrounded by a dielectric material 500 formed above a substrate 122. In an embodiment, the conductive interconnects 128 and 130 are formed in a dielectric material 500 by a damascene or a dual damascene process. In an embodiment, the conductive interconnect 130 includes a barrier layer, such as titanium nitride, ruthenium, tantalum, tantalum nitride, and a fill metal, such as copper, tungsten. In an embodiment, the conductive interconnects 128 and 130 are fabricated using a subtractive etch process when materials other than copper are utilized. In one such embodiment, the conductive interconnects 128 and 130 include a material such as but not limited to titanium nitride, ruthenium, tantalum, tantalum nitride. In some examples, the dielectric material 500 includes a material such as but not limited to silicon dioxide, silicon nitride, silicon carbide, or carbon doped silicon oxide. In an embodiment, the dielectric material 500 has an uppermost surface substantially coplanar with an uppermost surface of the conductive interconnects 128 and 130. The dielectric material 500 may include a material that is the same or substantially the same as the dielectric material 102 described above. Depending on embodiments, the dielectric material 500 has a total thickness between 70 nm-120 nm. In some examples, at least one of the conductive interconnects 128 or 130 is electrically connected to a circuit element such as an access transistor (not shown). Logic devices such as access transistors may be integrated with memory devices such as a SOT device to form embedded memory.

Figure 5B:
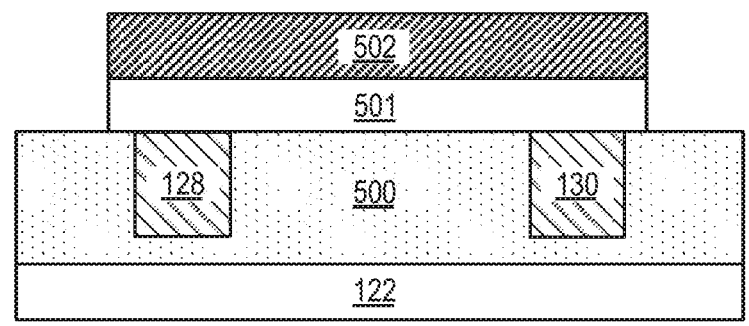
FIG. 5B illustrates a cross-sectional view of the structure in FIG. 5A following formation of a mask to pattern the electrode layer and following the patterning of the electrode layer to form an electrode including the SOT material.

FIG. 5B illustrates a cross-sectional view of the structure in FIG. 5A following the deposition of a layer 501 including a spin orbit coupling material (herein, SOC layer 501) on the conductive interconnects 128 and 130 and on the dielectric material 500. In an embodiment, the SOC layer 501 is blanket deposited using a physical vapor deposition (PVD) or a chemical vapor deposition (CVD) process. In an embodiment, the SOC layer 501 includes a material that is the same or substantially the same as the material of the SOC electrode 101. In some embodiments, the SOC layer 501 has a thickness that is between 2 nm and 20 nm.

In some embodiments, the mask 502 is formed by a lithographic process. In other embodiments, the mask 502 includes a dielectric material that has been patterned. The mask 502 defines a size of an electrode that will subsequently be formed. In some embodiments, the mask 502 has a rectangular shape as is depicted in the plan view illustration of FIG. 1B described above.

Figure 5C:
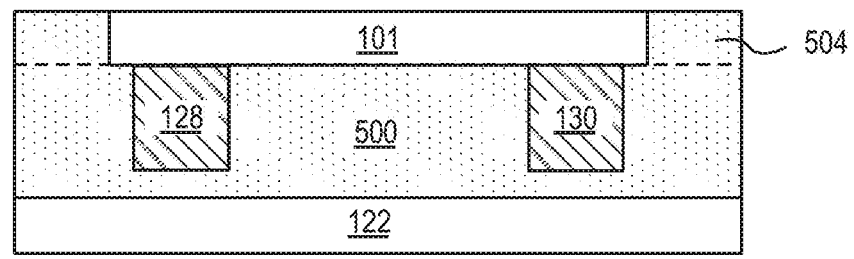
FIG. 5C illustrates a cross-sectional view of the structure in FIG. 5B following the deposition of a dielectric layer on the electrode and planarization of the dielectric layer and the mask.

FIG. 5C illustrates a cross-sectional view of the structure in FIG. 5B following the patterning of the SOC layer 501 to form an SOT electrode 101 and following the deposition of a dielectric material 504 and a planarization process. In an embodiment, the SOC layer 501 is patterned by a plasma etch process selectively to the mask 502. In an embodiment, a dielectric material 504 is blanket deposited on the mask 502 and on the dielectric material 500. The dielectric material 504 may be formed by a PECVD deposition process. In some examples, the dielectric material 504 may include a material that is substantially the same as the material of the dielectric material 500. In some examples the PECVD deposition process may include a blanket deposition of the dielectric material 504.

A planarization process is carried out, for example, to remove the dielectric material 504 above the mask 502 and continued until almost all of the mask 502 is removed. The portions of the of dielectric material 504 remains adjacent to the SOT electrode 101 after the planarization process. In an embodiment, the dielectric material 504 is further planarized until the mask 502 is removed. In one such embodiment, a top portion of the SOT electrode is also removed. The resulting SOT electrode 101 has a thickness between 2 nm and 10 nm.

Figure 5D:
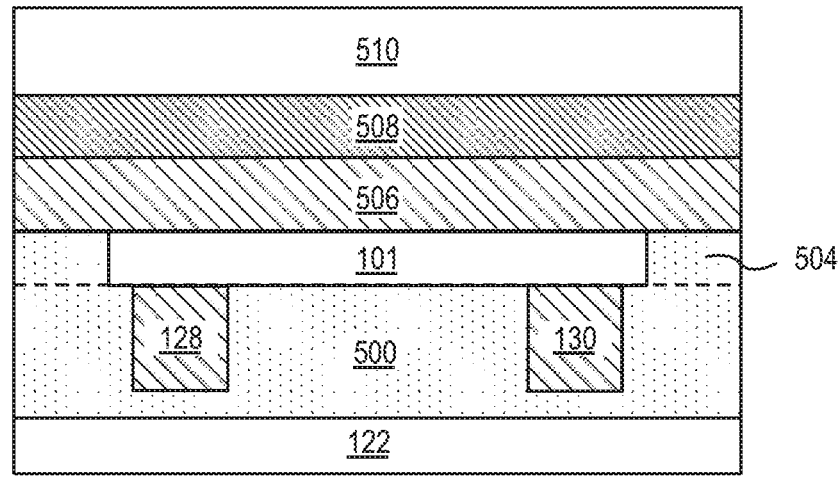
FIG. 5D illustrates a cross-sectional view of the structure in FIG. 5C following the formation of a free magnet structure including a first free magnetic layer on the electrode and on the dielectric layer, a conductive spacer on the free magnetic layer, and a second free magnetic layer on the spacer.

FIG. 5D illustrates a cross-sectional view of the structure in 5C following the formation of a free magnetic layer 506, a spacer layer 508 and a free magnetic layer 510. In some embodiments, the free magnetic layer 506 is blanket deposited on the on the dielectric material 504, and on the SOT electrode 101. In an embodiment, free magnetic layer 506 includes a material that is the same or substantially the same as the material of the free magnet 108. In some embodiments, the spacer layer 508 is blanket deposited on the free magnetic layer 506. In an embodiment, the spacer layer 508 includes a material that is the same or substantially the same as the material of the spacer layer 110. In some embodiments, the free magnetic layer 510 is blanket deposited on the spacer layer 508. In an embodiment, the free magnetic layer 510 includes a material that is the same or substantially the same as the material of the free magnet 112. In some embodiments, the deposition process is carried without an air break and the free magnetic layer 506, the spacer layer 508 and the free magnetic layer 510 are blanket deposited using a variety of deposition processes in a cluster tool. Some layers may be deposited using a physical vapor deposition (PVD) process, for example Other examples of deposition processes may include a co-sputter or a reactive sputtering process.

Figure 5E:
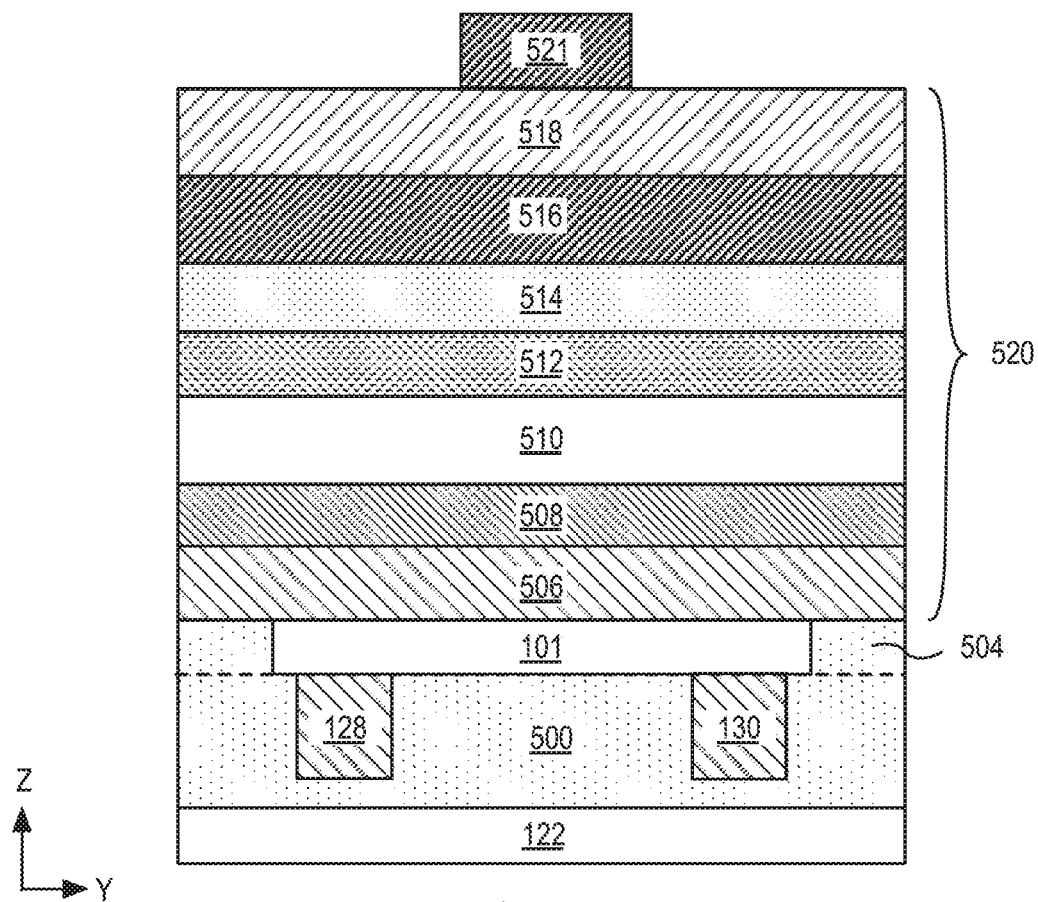
FIG. 5E illustrates a cross-sectional view of the structure in FIG. 5D following the formation of a tunnel barrier layer, a fixed magnetic layer, a SAF structure, and a capping electrode layer to form a material layer stack for magnetic tunnel junction device.

FIG. 5E illustrates a cross-sectional view of the structure in FIG. 5D following the formation of the remaining layers to form a material layer stack 520 to form a pMTJ device on the SOT electrode 101.

In the illustrative embodiment, a tunnel barrier layer 512 is blanket deposited on the free magnetic layer 510. In an embodiment, the tunnel barrier layer 512 includes a material, such as MgO or $Al_2O_3$. In an exemplary embodiment, the tunnel barrier layer 512 is an MgO and is deposited using a reactive sputter process. In an embodiment, the reactive sputter process is carried out at room temperature. In an embodiment, the tunnel barrier layer 512 is deposited to a thickness between 0.8 nm to 1 nm. In an embodiment, the deposition process is carried out in a manner that yields a tunnel barrier layer 512 having an amorphous structure. In some examples, the amorphous tunnel barrier layer 512 becomes crystalline after a high temperature anneal process to be described further below. In other embodiments, the tunnel barrier layer 512 is crystalline as deposited.

In an embodiment, the fixed magnetic layer 514 is blanket deposited on an uppermost surface of the tunnel barrier layer 512. In an embodiment, the deposition process includes a physical vapor deposition (PVD) or a plasma enhanced chemical vapor deposition process. In an embodiment, the PVD deposition process includes an RF or a DC sputtering process. In an exemplary embodiment, the fixed magnetic layer 514 is $Co_{100-x-y}Fe_xB_y$, where X and Y each represent atomic percent, further where X is between 50 and 80 and Y is between 10 and 40, and further where the sum of X and Y is less than 100. In some embodiments, the fixed magnetic layer 514 includes a material that is the same or substantially the same as the material of the fixed magnet 116 described above. In some examples, the fixed magnetic layer 514 may be deposited to a thickness between 1.0 nm and 3.0 nm.

The process is continued with deposition of layers utilized to form a SAF structure 516. In some embodiments, the layers utilized to form SAF structure 516 are blanket deposited on the fixed magnetic layer 514 using a PVD process. The layers utilized to form SAF structure 516 are the same or substantially the same as the layers in the SAF structure 118 described above.

In some embodiments, the process utilized to deposit all layers of the material layer stack 520, illustrated in FIG. 5E, is carried without an air break. The individual layers may be blanket deposited using a variety of deposition processes in a cluster tool. Some layers may be deposited using a physical vapor deposition (PVD) process, for example. Other layers, for example, may be deposited by processes that may include a co-sputter or a reactive sputtering process. In the illustrative embodiment, formation of the SAF structure 516 includes blanket depositing a non-magnetic spacer layer (not shown) on the fixed magnetic layer 514. In some embodiments, the non-magnetic spacer layer includes a metal such as Ta, Ru or Ir.

In an embodiment, the deposition process concludes with a blanket deposition of a capping layer 518 on an uppermost surface of the SAF structure 516. In an embodiment, the capping layer 518 includes a material that is suitable to act as a hardmask during a subsequent etching of the pMTJ material layer stack 520 to form a pMTJ device on the SOT electrode 101. In an embodiment, the capping layer 518 includes a material such as TiN, Ta or TaN. In an embodiment, the thickness of the capping layer 518 is between 5 nm and 70 nm. The thickness of the capping layer 518 is chosen to accommodate patterning of the pMTJ material layer stack 520 to form a pMTJ device.

In an embodiment, after all the layers in the pMTJ material layer stack 520 are deposited, an anneal is performed. In an embodiment, the anneal is performed immediately post deposition but before patterning of the pMTJ material layer stack 520. A post-deposition anneal of the pMTJ material layer stack 520 is carried out in a furnace in a forming gas environment. In an embodiment, the forming gas includes a mixture of $H_2$ and $N_2$ gas. In an embodiment, the anneal temperature ranges between 300 and 350 degrees Celsius.

In an embodiment, the annealing process also promotes solid phase epitaxy of the free magnetic layer 510 to follow a crystalline template of the tunnel barrier layer 512 (e.g., MgO) that is directly above the free magnetic layer 510. In an embodiment, the anneal also promotes solid phase epitaxy of the fixed magnetic layer 514 to follow a crystalline template of the tunnel barrier layer 512 (e.g., MgO) that is directly below the fixed magnetic layer 514. <001> Lattice matching between the tunnel barrier layer 512 and the free magnetic layer 510 and <001> lattice matching between the tunnel barrier layer 512 and the fixed magnetic layer 514 enables a TMR ratio of at least 90% to be obtained in the pMTJ material layer stack 520.

In an embodiment, the annealing process is also performed in the presence of a magnetic field which sets a direction of magnetization of the fixed magnetic layer 514 and of the free magnetic layers 506 and 510. In an embodiment, during the annealing process, an applied magnetic field that is directed perpendicular (along the Z axis) to a horizontal plane (along the Y axis) of pMTJ material layer stack 520 enables a perpendicular anisotropy to be set in the fixed magnetic layer 514, in the free magnetic layers 506 and 510.

A mask 521 is formed above the material layer stack 520. In some embodiments, the mask 521 is formed by a lithographic process. In other embodiments, the mask 521 includes a dielectric material that has been patterned. The mask 521 defines a shape and size of a pMTJ device and a location where the pMTJ device is to be subsequently formed with respect the SOT electrode 101. In some embodiments, the mask 521 has a circular shape as is depicted in the plan view illustration of FIG. 1B. In the illustrative embodiment, the mask is formed on a plane above, but laterally between from the conductive interconnects 128 and 130. The mask 521 may be formed approximately midway between conductive interconnects 128 and 130, for example, so that a pMTJ device (to be formed) may be influenced by a spin current having a magnitude that is substantially independent of the direction of the charge current through the SOT electrode 101, as discussed above.

Figure 5F:
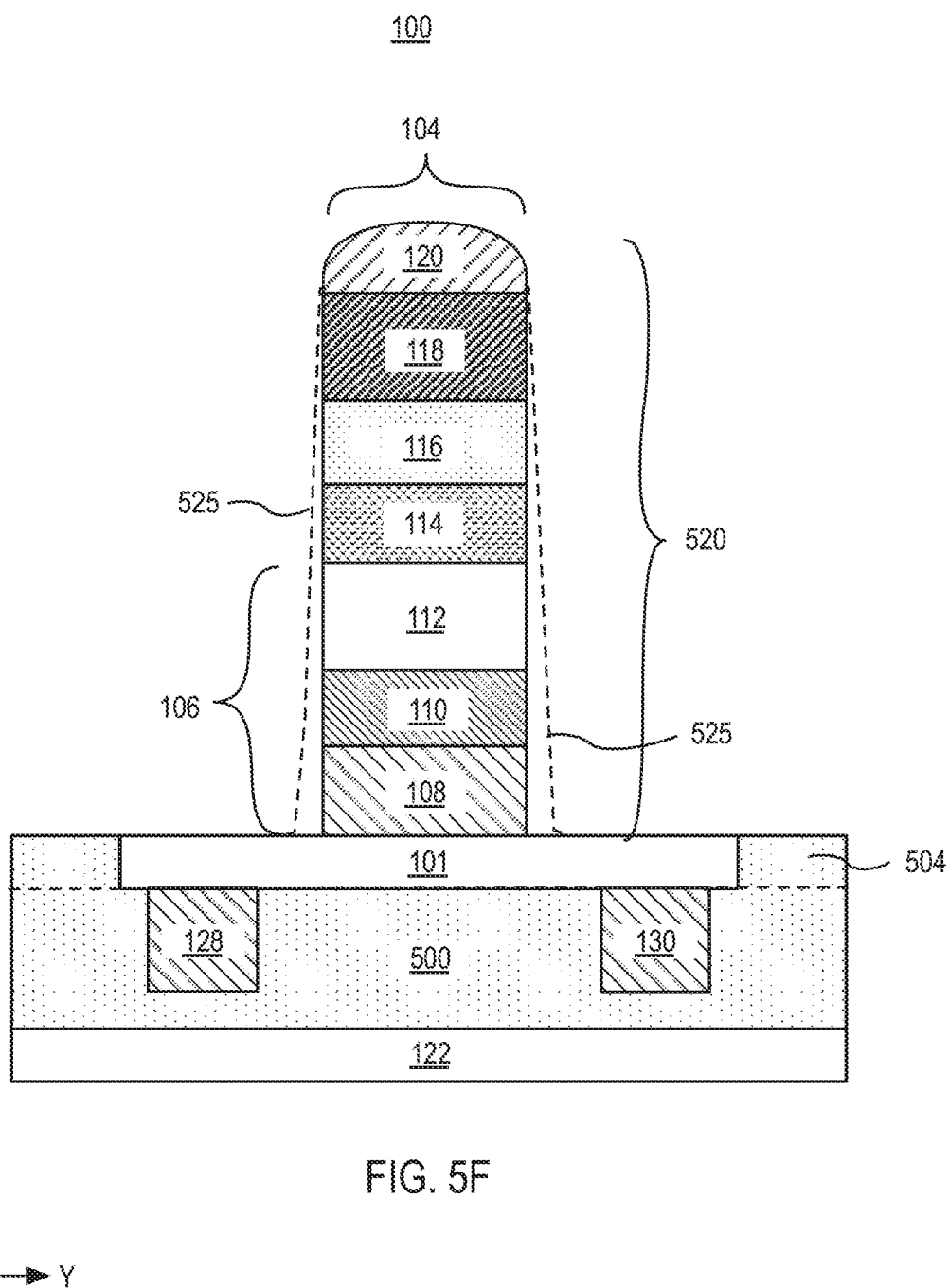
FIG. 5F illustrates a cross-sectional view of the structure in FIG. 5D following the process of etching the material layer stack to form a magnetic tunnel junction device on the electrode including the SOT material.

FIG. 5F illustrates a cross-sectional view of the structure in FIG. 5E following patterning and etching of the material layer stack 520. In an embodiment, the patterning process first includes etching the capping layer 518 by a plasma etch process to form an electrode 120. In an embodiment, plasma etch process possesses sufficient ion energy and chemical reactivity to render vertical etched sidewalls of the electrode layer 120. In an embodiment, the plasma etch process is then continued to pattern the remaining layers of the material layer stack 520 to form a pMTJ device 104. The plasma etch process etches the various layers in the material layer stack 520 to form a SAF structure 118, a fixed magnet 116, a tunnel barrier 114, a free magnet structure 106, including a free magnet 112, spacer layer 110 and free magnet 108. The plasma etch process also exposes the SOT electrode 101 and the dielectric material 504. In some embodiments, depending on the etch parameters, the pMTJ device 104 may have sidewalls that are tapered, as indicated by the dashed lines 525, during the etching process. The pMTJ device 104 formed over an SOT electrode 101, coupled with a conductive interconnects 128 and 130 constitutes the perpendicular spin orbit torque memory device 100 described in association with FIG. 1A.

Figure 5G:
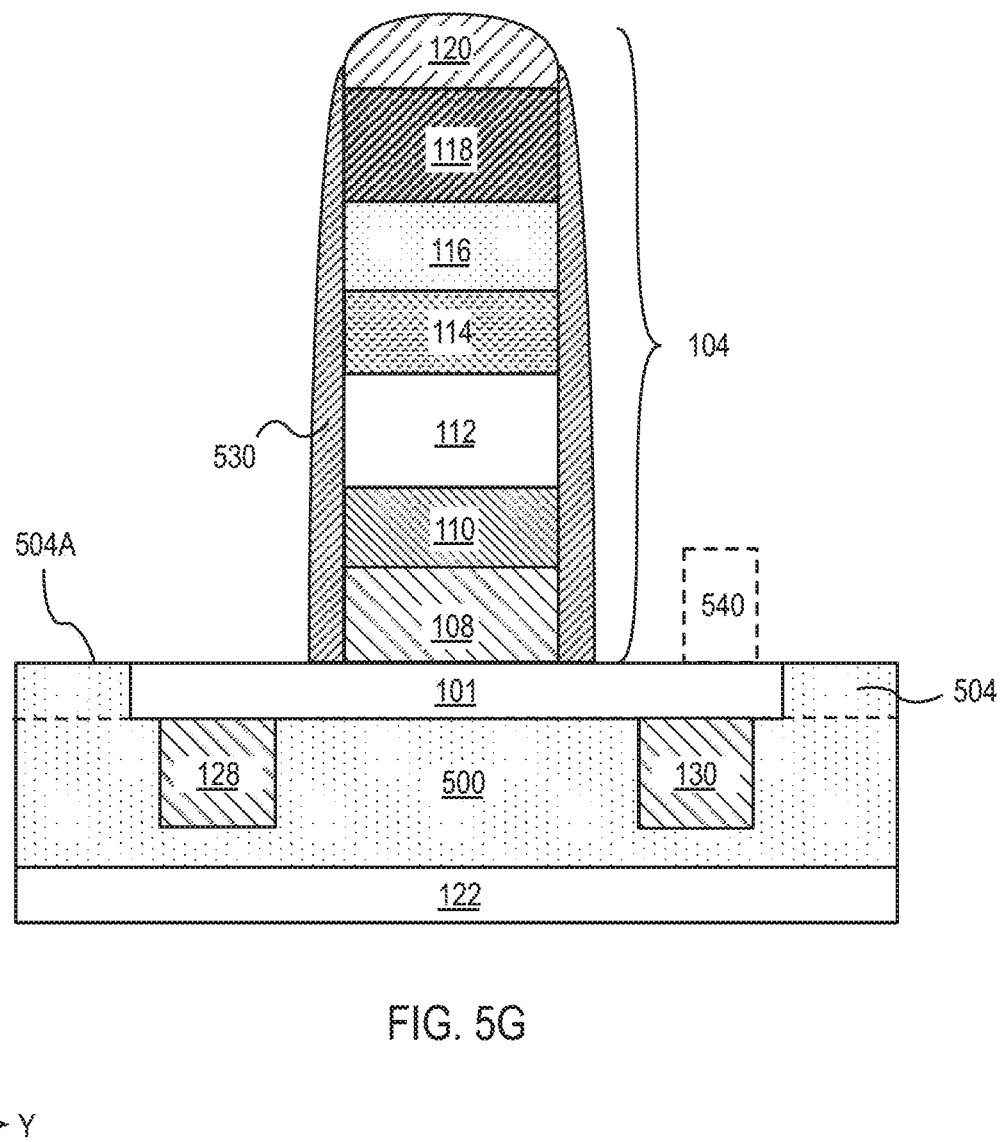
FIG. 5G illustrates a cross-sectional view of the structure in FIG. 5E following the formation of a dielectric spacer adjacent to the magnetic tunnel junction device and on portions of the electrode.

FIG. 5G illustrates a cross-sectional view of the structure in FIG. 5F following the formation of a dielectric spacer 530 adjacent to the pMTJ device 104. In an embodiment, a dielectric spacer layer is deposited on the pMTJ device 104 and on the uppermost surface of the SOT electrode 101 and on the dielectric material 504. In an embodiment, the dielectric spacer layer is deposited without a vacuum break following the plasma etch process utilized to form the pMTJ device 104. In other embodiments the spacer layer is blanket deposited by a PECVD deposition process. The dielectric spacer layer may also be deposited using a PVD or a PECVD deposition process. In some embodiments, the dielectric spacer layer includes a material such as, but not limited to, silicon nitride (e.g., comprising predominantly silicon and nitrogen), carbon doped silicon nitride (e.g., comprising predominantly silicon and nitrogen and a minor faction of carbon), or silicon carbide (e.g., comprising predominantly silicon and carbon). The dielectric spacer layer may include an insulator layer that does not have an oxygen content to minimize potential oxidation of magnetic layers. After blanket deposition dielectric spacer layer is etched by a plasma etch process to form the dielectric spacer 530 on sidewalls of the pMTJ device 104. In some examples, the etch process may cause an uppermost surface 504A of the dielectric material 504 to become partially recessed leading to partial exposure of sidewalls of the SOT electrode

101. Exposed sidewalls of the SOT electrode 101 may be covered with further dielectric material during subsequent processing operations.

In some embodiments, the SOT electrode 101 is formed on only one of the conductive interconnects 128 or 130. In some such embodiments, the remaining one of the conductive interconnects 128 or 130 is fabricated at a later operation after the pMTJ 104 has been patterned. A location where the remaining one of the conductive interconnects 128 or 130 may be formed is depicted by a dashed box 540 in the cross-sectional illustration of FIG. 5G.

While the method described above includes descriptions for forming the structure in FIG. 1A, similar methods may be utilized to form the structures illustrated in FIGS. 2A and in 2B.

Figure 6:
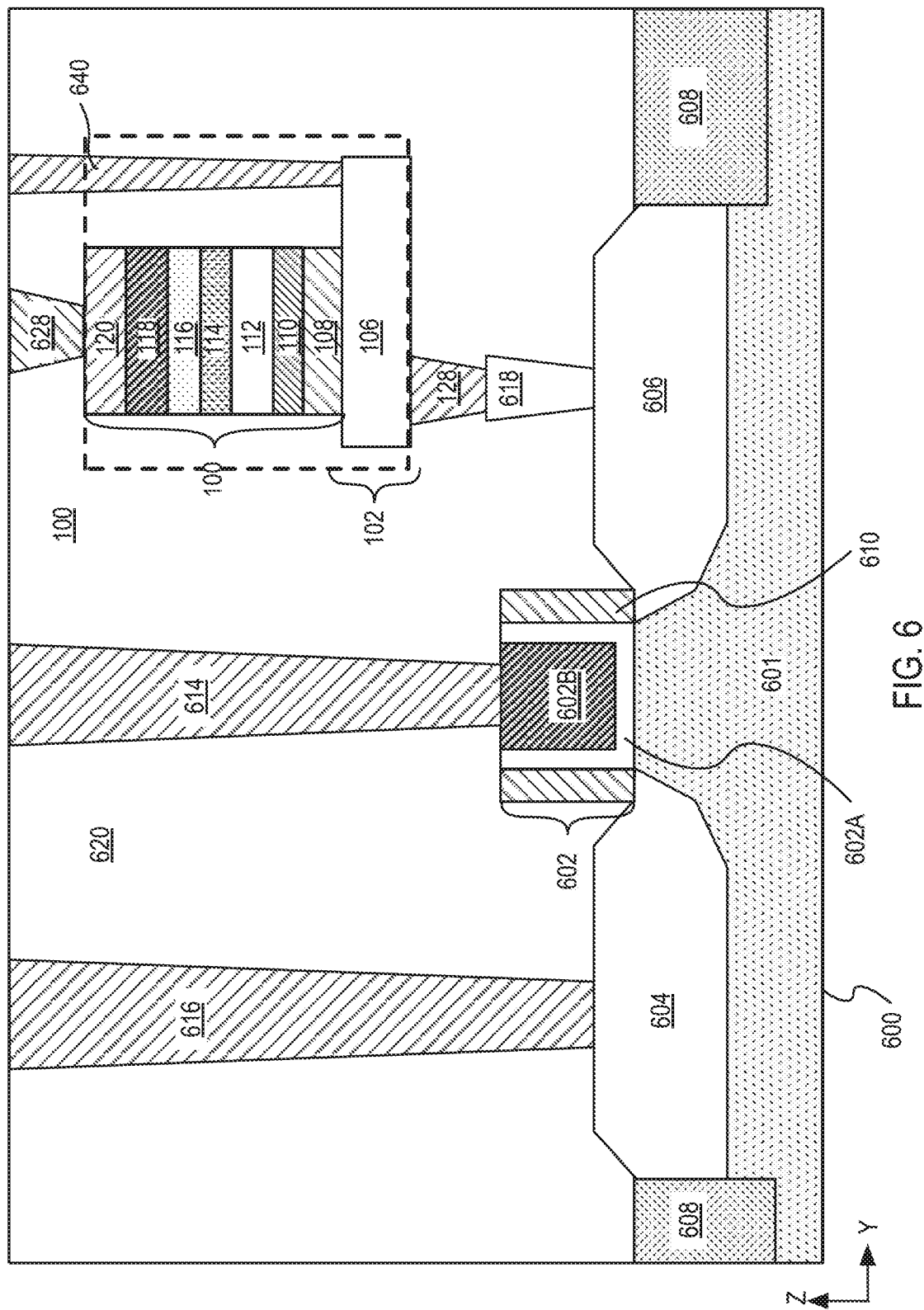
FIG. 6 illustrates a cross-sectional view of a SOT memory device coupled having one terminal coupled to a first transistor, a second terminal coupled to a second transistor, and a third terminal coupled to a bit line.

FIG. 6 illustrates a SOT device coupled to an access transistor 600. In an embodiment, the pSOT memory device 100 includes a MTJ device 104 on a SOT electrode 102, described in association with FIGS. 1A and 2. The pSOT memory device 100 may include one or more features of the pSOT memory device 100 described above in embodiments, associated with FIGS. 1A-1E. In other embodiments, a pSOT device such as pSOT device 200A or 200B may be coupled with the transistor 600.

In an embodiment, the transistor 600 has a source region 604, a drain region 606 and a gate 602. The transistor 600 further includes a gate contact 614 above and electrically coupled to the gate 602, a source contact 616 above and electrically coupled to the source region 604, and a drain contact 618 above and electrically coupled to the drain region 606 as is illustrated in FIG. 6.

In the illustrative embodiment, the MTJ device 104 includes the electrode 120, SAF structure 118 coupled with the fixed magnet 116, the free magnet structure 106 and the tunnel barrier 114 between the free magnet structure 106 and the fixed magnet 116. The free magnet structure includes the free magnet 108 and 112 and the spacer layer including tungsten between the free magnets 108 and 112. The free magnet 108 is in contact with the SOT electrode 102.

In the illustrative embodiment, one portion of electrode 102 is in electrical contact with the drain contact 618 of transistor 600 through the conductive interconnect 128. The conductive interconnect 128 may be directly above the drain contact 618 as shown. A pMTJ contact 628 is on and electrically coupled with the electrode 120 of the MTJ device 104. An interconnect metallization structure 640 is on and electrically coupled with the SOT electrode 101 and the MTJ device 104 is between the drain contact 618 and the interconnect metallization structure 640. In the illustrative embodiment, the MTJ device 104 is laterally between the drain contact 618 and interconnect metallization structure 640. In some embodiments, the MTJ device 104 is laterally closer to the drain contact 618 than to interconnect metallization structure 640. In other embodiments, the MTJ device 104 is laterally closer to the interconnect metallization structure 640 than to the drain contact 618. In some embodiments, the MTJ device 104 is approximately midway, laterally, between the interconnect metallization structure 640 and the drain contact 618.

In an embodiment, the underlying substrate 601 represents a surface used to manufacture integrated circuits. Suitable substrate 601 includes a material such as single crystal silicon, polycrystalline silicon and silicon on insulator (SOI), as well as substrates formed of other semiconductor materials. In some embodiments, the substrate 601 is the same as or substantially the same as the substrate 122. The substrate 601 may also include semiconductor materials, metals, dielectrics, dopants, and other materials commonly found in semiconductor substrates.

In an embodiment, the transistor 600 associated with substrate 601 are metal-oxide-semiconductor field-effect transistors (MOSFET or simply MOS transistors), fabricated on the substrate 601. In some embodiments, the transistor 600 is an access transistor 600. In various implementations of the invention, the transistor 600 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, the access transistor 600 of substrate 601 includes a gate 602. In some embodiments, gate 602 includes at least two layers, a gate dielectric layer 602A and a gate electrode 602B. The gate dielectric layer 602A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 602A to improve its quality when a high-k material is used.

The gate electrode 602B of the access transistor 600 of substrate 601 is formed on the gate dielectric layer 602A and may consist of at least one P-type work function metal or N-type work function metal, depending on whether the transistor is to be a PMOS or an NMOS transistor. In some implementations, the gate electrode 602B may consist of a stack of two or more metal layers, where one or more metal layers are work function metal layers and at least one metal layer is a conductive fill layer.

For a PMOS transistor, metals that may be used for the gate electrode 602B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 602B may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode 602B may consist of one or more U-shaped metal layers formed atop one or more planar, non-U-shaped layers.

In some implementations of the invention, a pair of sidewall spacers 610 are on opposing sides of the gate 602. The sidewall spacers 610 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source region 604 and drain region 606 are formed within the substrate adjacent to the gate stack of each MOS transistor. The source region 604 and drain region 606 are generally formed using either an implantation/diffusion process or an etching/deposition process. In the former process, dopants such as boron, aluminum, antimony, phosphorous, or arsenic may be ion-implanted into the substrate to form the source region 604 and drain region 606. An annealing process that activates the dopants and causes them to diffuse further into the substrate typically follows the ion implantation process. In the latter process, the substrate 601 may first be etched to form recesses at the locations of the source and drain regions. An epitaxial deposition process may then be carried out to fill the recesses with material that is used to fabricate the source region 604 and drain region 606. In some implementations, the source region 604 and drain region 606 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 604 and drain region 606 may be formed using one or more alternate semiconductor materials such as germanium or a group III-V material or alloy. And in further embodiments, one or more layers of metal and/or metal alloys may be used to form the source region 604 and drain region 606. In the illustrative embodiment, an isolation 608 is adjacent to the source region 604, drain region 606 and portions of the substrate 601. In the illustrated embodiment, a dielectric layer 620 is adjacent to the gate contact 614, drain contact 618, source contact 616 and the pSOT memory device 100.

In an embodiment, the source contact 616, the drain contact 618 and gate contact 614 each include a multi-layer stack. In an embodiment, the multi-layer stack includes two or more distinct layers of metal such as a layer of Ti, Ru or Al and a conductive cap on the layer of metal. The conductive cap may include a material such as W or Cu.

The isolation 608 and dielectric layer 620 may include any material that has sufficient dielectric strength to provide electrical isolation such as, but not, limited silicon dioxide, silicon nitride, silicon oxynitride, carbon doped nitride and carbon doped oxide.

Figure 7:
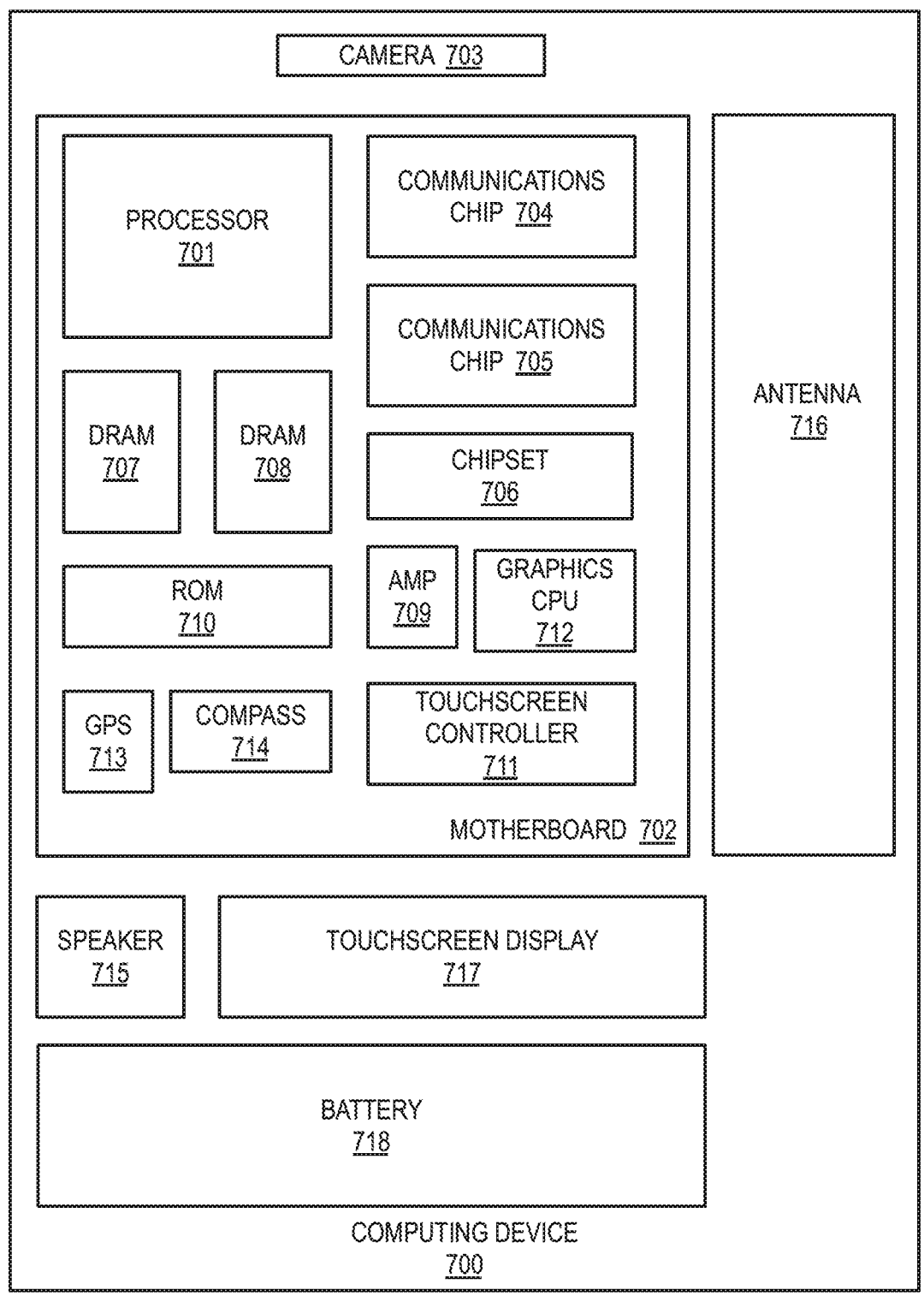
FIG. 7 illustrates a computing device in accordance with embodiments of the present disclosure.

FIG. 7 illustrates a computing device 700 in accordance with embodiments of the present disclosure. As shown, computing device 700 houses a motherboard 702. Motherboard 702 may include a number of components, including but not limited to a processor 701 and at least one communications chip 704 or 705. Processor 701 is physically and electrically coupled to the motherboard 702. In some implementations, communications chip 705 is also physically and electrically coupled to motherboard 702. In further implementations, communications chip 705 is part of processor 701.

Depending on its applications, computing device 700 may include other components that may or may not be physically and electrically coupled to motherboard 702. These other components include, but are not limited to, volatile memory (e.g., DRAM), non-volatile memory (e.g., ROM), flash memory, a graphics processor, a digital signal processor, a crypto processor, a chipset 706, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 705 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 705 may implement any of a number of wireless standards or protocols, including but not limited to Wi-Fi (IEEE 802.11 family), WiMAX (IEEE 802.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communications chips 704 and 705. For instance, a first communications chip 705 may be dedicated to shorter range wireless communications such as Wi-Fi and Bluetooth and a second communications chip 704 may be dedicated to longer range wireless communications such as GPS, EDGE, GPRS, CDMA, WiMAX, LTE, Ev-DO, and others.

Processor 701 of the computing device 700 includes an integrated circuit die packaged within processor 701. In some embodiments, the integrated circuit die of processor 701 includes one or more memory devices, such as a pSOT memory device 100 including a pMTJ device 104 in accordance with embodiments of the present disclosure. The term "processor" may refer to any device or portion of a device that processes electronic data from registers and/or memory to transform that electronic data into other electronic data that may be stored in registers and/or memory.

Communications chip 705 also includes an integrated circuit die packaged within communication chip 705. In another embodiment, the integrated circuit die of communications chips 704, 705 include a SOT memory device such as a pSOT memory device 100 including a pMTJ device 104 on a SOT electrode 101.

Depending on its applications, computing device 700 may include other components that may or may not be physically and electrically coupled to motherboard 702. These other components may include, but are not limited to, volatile memory (e.g., DRAM) 707, 708, non-volatile memory (e.g., ROM) 710, a graphics CPU 712, flash memory, global positioning system (GPS) device 713, compass 714, a chipset 706, an antenna 716, a power amplifier 709, a touchscreen controller 711, a touchscreen display 717, a speaker 715, a camera 703, and a battery 718, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 700 and discussed above may contain a stand-alone integrated circuit memory die that includes one or more arrays of memory cells including one or more memory devices, such as a spin orbit torque memory device 100, including a pMTJ device 104 on a SOT electrode 101, built in accordance with embodiments of the present disclosure.

In various implementations, the computing device 700 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
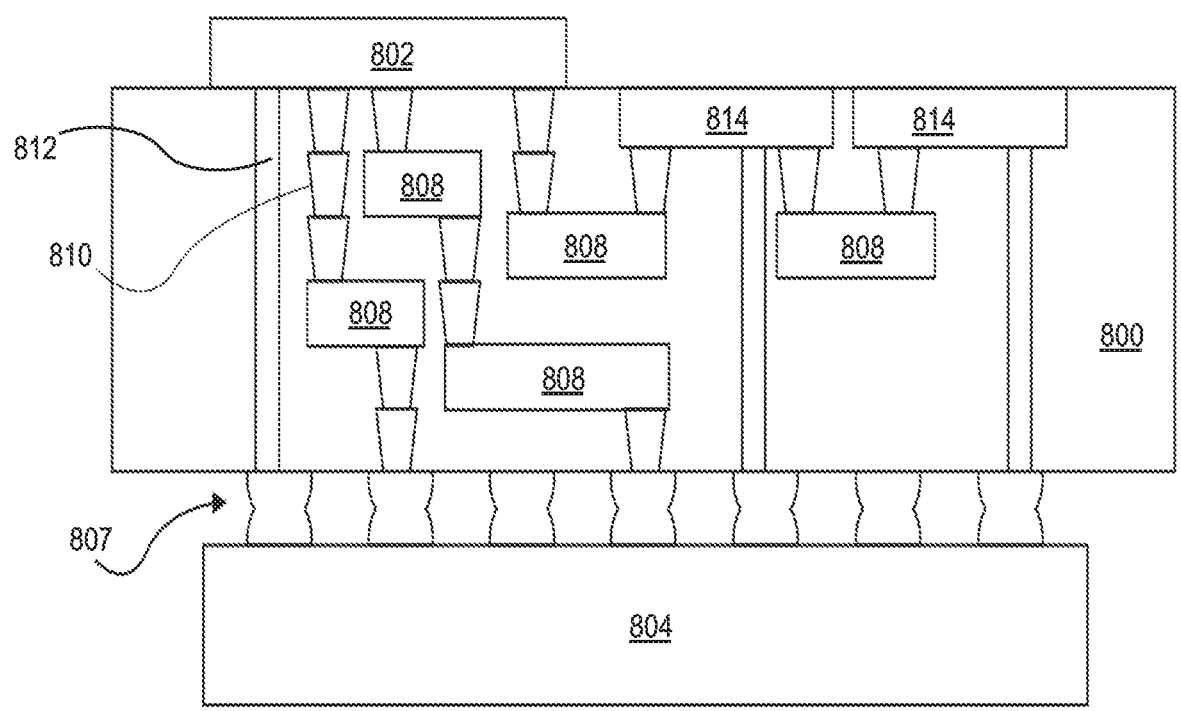
FIG. 8 illustrates an integrated circuit (IC) structure that includes one or more embodiments of the present disclosure.

FIG. 8 illustrates an integrated circuit (IC) structure 800 that includes one or more embodiments of the disclosure. The integrated circuit (IC) structure 800 is an intervening substrate used to bridge a first substrate 802 to a second substrate 804. The first substrate 802 may be, for instance, an integrated circuit die. The second substrate 804 may be, for instance, a memory module, a computer mother, or another integrated circuit die. Generally, the purpose of an integrated circuit (IC) structure 800 is to spread a connection to a wider pitch or to reroute a connection to a different connection. For example, an integrated circuit (IC) structure 800 may couple an integrated circuit die to a ball grid array (BGA) 807 that can subsequently be coupled to the second substrate 804. In some embodiments, the first and second substrates 802/804 are attached to opposing sides of the integrated circuit (IC) structure 800. In other embodiments, the first and second substrates 802/804 are attached to the same side of the integrated circuit (IC) structure 800. And in further embodiments, three or more substrates are interconnected by way of the integrated circuit (IC) structure 800.

The integrated circuit (IC) structure 800 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials. The integrated circuit (IC) structure may include metal interconnects 808 and vias 810, including but not limited to through-silicon vias (TSVs) 812. The integrated circuit (IC) structure 800 may further include embedded devices 814, including both passive and active devices. Such devices include, but are not limited to, capacitors, decoupling capacitors, resistors, inductors, fuses, diodes, transformers, device structure including transistors, such as transistors 600 (described in FIG. 6) coupled with a with one at least one SOT memory device such as the pSOT memory device 100. In one embodiment, the pSOT memory device 100 (described in FIG. 6) includes the pMTJ device 104 on the SOT electrode 101, where the pMTJ device 104 includes a free magnet structure 106 having a free magnet 108, a spacer layer including tungsten on the free magnet 108 and a free magnet 112 on the spacer layer 110. The integrated circuit (IC) structure 800 may further include embedded devices 814 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 800. In accordance with embodiments of the present disclosure, apparatuses or processes disclosed herein may be used in the fabrication of integrated circuit (IC) structure 800.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of a spin orbit torque memory device such as the spin orbit torque memory device 100. The spin orbit torque memory devices 100 may be used in an embedded non-volatile memory application.

Thus, embodiments of the present disclosure include spin orbit torque memory devices and methods to form the same.

In a first example, a pSOT memory device includes a first electrode including a spin orbit torque material. The pSOT memory device further includes a material layer stack adjacent to the first electrode, where the material layer stack includes a free magnet, a fixed magnet above the first electrode, where at least one of the free magnet or the fixed magnet includes two magnetic layers and a spacer layer including tungsten therebetween. The pSOT memory device further includes a tunnel barrier between the free magnet and the fixed magnet and a second electrode coupled with the fixed magnet.

In second examples, for any of first examples, the free magnet includes a first free magnet, a second free magnet, where the first free magnet is ferromagnetically coupled with the second free magnet, and a spacer including tungsten between the first free magnet and the second free magnet.

In third examples, for any of the first through second examples, the spacer has a thickness between 0.05 nm and 0.3 nm.

In fourth examples, for any of the first through third examples, the first free magnet has a thickness that is greater than a thickness of the second free magnet and wherein the first free magnet and the second free magnet have a combined total thickness that is less than 5 nm.

In fifth examples, for any of the first through fourth examples, the first free magnet includes at least one of cobalt, iron or boron and is adjacent to first electrode.

In sixth examples, for any of the first through fifth examples, the second free magnet include at least one of cobalt, iron or boron and is adjacent to first electrode.

In seventh examples, for any of the first through sixth examples, the fixed magnet structure includes a first fixed magnet, a second fixed magnet, where the second fixed magnet is ferromagnetically coupled with the first fixed magnet and a second spacer including tungsten between the first fixed magnet and the second fixed magnet.

In eighth examples, for any of the first through seventh examples, the second spacer has a thickness between 0.05 nm and 0.3 nm.

In ninth examples, for any of the first through eighth examples, wherein the first fixed magnet has a thickness between 0.5 nm-2.5 nm.

In tenth examples, for any of the ninth examples, the second fixed magnet has a thickness between 0.5 nm-2.5 nm.

In eleventh examples, for any of the ninth through tenth examples, the first fixed magnet and the second fixed magnet include at least one of cobalt, boron and iron.

In twelfth examples, for any of the first through eleventh examples, the spacer is a first spacer and the fixed magnet includes a first fixed magnet, a second fixed magnet, where the second fixed magnet is ferromagnetically coupled with the first fixed magnet, and a second spacer including tungsten between the first fixed magnet and the second fixed magnet.

In thirteenth examples, for any of the first through twelfth examples, the pSOT memory device further includes a synthetic anti-ferromagnet (SAF) between the fixed layer and the second electrode, where the SAF is anti-ferromagnetically coupled with the fixed magnet.

In a fourteenth example, a method of fabricating a perpendicular spin orbit torque (pSOT) device includes depositing a layer including a spin orbit torque material above a substrate and patterning the layer including the spin orbit torque (SOT) material to form a SOT electrode. The method further includes forming a material layer stack for a magnetic tunnel junction (MTJ) memory device on the SOT electrode. The method of forming the material layer stack includes forming a free magnetic layer, forming a tunnel barrier layer on the free magnetic layer, forming a fixed magnetic layer on the tunnel barrier layer, where forming the free magnetic layer or the fixed magnetic layer includes forming a first magnetic layer. The method further includes forming a second magnetic layer and forming a spacer including tungsten therebetween. The method further includes depositing a conductive layer on the fixed magnetic layer and etching the material layer stack to form a magnetic tunnel junction (MTJ) device over a portion of the SOT electrode. In a fifteenth example, for any of the fourteenth examples, the method of forming the free magnetic layer includes forming a first magnetic layer on the SOT electrode, forming a second magnetic layer above the first magnetic layer and forming a spacer including tungsten therebetween.

In sixteenth examples, for any of the fourteenth through fifteenth examples, forming the fixed magnetic layer includes forming a third magnetic layer on the tunnel barrier layer, forming a fourth magnetic layer above the third magnetic layer and forming a spacer including tungsten therebetween.

In seventeenth examples, for any of the fourteenth through sixteenth examples, the method further includes performing a high temperature anneal to enable <001> lattice matching of the first and the second free magnetic layer to the tunnel barrier layer.

In eighteenth examples, for any of the fourteenth through seventeenth examples, the method further includes forming a spacer including a dielectric material on a sidewall of the MTJ device.

In nineteenth examples, an apparatus includes a transistor above a substrate, where the transistor includes a drain contact coupled to a drain, a source contact coupled to a source and a gate contact coupled to a gate. The apparatus further includes a perpendicular spin orbit torque (pSOT) memory device coupled with the drain contact, where the pSOT memory device includes a first electrode, including a spin orbit torque material. The pSOT memory device further includes a material layer stack adjacent to the first electrode, where the material layer stack includes a free magnet, a fixed magnet above the first electrode, where at least one of the free magnet or the fixed magnet includes two magnetic layers and a spacer layer including tungsten therebetween. The pSOT memory device further includes a tunnel barrier between the free magnet and the fixed magnet and a second electrode coupled with the fixed magnet.

In twentieth examples, for any of the nineteenth examples, the system further includes a battery coupled to power at least one of the processor or memory.

What is claimed is:

1. A three-terminal perpendicular spin orbit torque (pSOT) memory device, comprising:
    a first electrode, comprising a spin orbit torque material;
    a first conductive interconnect coupled to a first end of the first electrode;
    a second conductive interconnect coupled to a second end of the first electrode, the second end opposite the first end;
    a material layer stack adjacent to the first electrode, the material layer stack comprising:
        a free magnet above the first electrode;
        a fixed magnet above the free magnet, wherein at least one of the free magnet or the fixed magnet comprises two magnetic layers and a spacer layer comprising tungsten therebetween;
        a tunnel barrier between the free magnet and the fixed magnet; and
        a second electrode coupled with the fixed magnet; and
    a contact coupled to the second electrode.

2. The pSOT memory device of claim 1, wherein the free magnet comprises:
    a first free magnet;
    a second free magnet, wherein the first free magnet is ferromagnetically coupled with the second free magnet; and
    the spacer layer between the first free magnet and the second free magnet.

3. The pSOT memory device of claim 2, wherein the spacer layer has a thickness between 0.05 nm and 0.3 nm.

4. The pSOT memory device of claim 2, wherein the first free magnet has a thickness that is greater than a thickness of the second free magnet, and wherein the first free magnet and the second free magnet have a combined total thickness of less than 5 nm.

5. The pSOT memory device of claim 2, wherein the first free magnet comprises at least one of cobalt, iron or boron and wherein the first free magnet is on the first electrode.

6. The pSOT memory device of claim 5, wherein the second free magnet comprises at least one of cobalt, iron, or boron.

7. The pSOT memory device of claim 1, wherein the fixed magnet structure comprises:
    a first fixed magnet;
    a second fixed magnet, wherein the second fixed magnet is ferromagnetically coupled with the first fixed magnet; and
    the spacer layer between the first fixed magnet and the second fixed magnet.

8. The pSOT memory device of claim 7, wherein the spacer layer has a thickness between 0.05 nm and 0.3 nm.

9. The pSOT memory device of claim 7, wherein the first fixed magnet has a thickness between 0.5 nm and 2.5 nm.

10. The pSOT memory device of claim 7, wherein the second fixed magnet has a thickness between 0.5 nm and 2.5 nm.

11. The pSOT memory device of claim 7, wherein the first fixed magnet and the second fixed magnet comprise at least one of cobalt, boron, or iron.

12. The pSOT memory device of claim 2, wherein the spacer layer is a first spacer layer and the fixed magnet comprises:
    a first fixed magnet;
    a second fixed magnet, wherein the second fixed magnet is ferromagnetically coupled with the first fixed magnet; and a second spacer layer comprising tungsten between the first fixed magnet and the second fixed magnet.

13. The pSOT memory device of claim 1, further comprising a synthetic anti-ferromagnet (SAF) between the fixed magnet and the second electrode.

14. A system comprising:
  a processor; and
  a three-terminal perpendicular spin orbit torque (pSOT) memory device coupled with the drain contact, the three-terminal pSOT memory device comprising:
    a first electrode, comprising a spin orbit torque material;
    a first conductive interconnect coupled to a first end of the first electrode;
    a second conductive interconnect coupled to a second end of the first electrode, the second end opposite the first end;
    a material layer stack adjacent to the first electrode, the material layer stack comprising:
      a free magnet above the first electrode;
      a fixed magnet above the free magnet, wherein at least one of the free magnet or the fixed magnet comprises two magnetic layers and a spacer layer comprising tungsten therebetween;
      a tunnel barrier between the free magnet and the fixed magnet; and
    a second electrode coupled with the fixed magnet; and
    a contact coupled to the second electrode.

15. The system of claim 14, further comprising a battery coupled to at least one of the processor or memory.

16. The system of claim 14, wherein the free magnet comprises:
  a first free magnet;
  a second free magnet, wherein the first free magnet is ferromagnetically coupled with the second free magnet; and
  the spacer layer between the first free magnet and the second free magnet.

17. The system of claim 16, wherein the spacer layer has a thickness between 0.05 nm and 0.3 nm.

18. The system of claim 16, wherein the first free magnet has a thickness that is greater than a thickness of the second free magnet, and wherein the first free magnet and the second free magnet have a combined total thickness of less than 5 nm.

19. The system of claim 16, wherein the first free magnet comprises at least one of cobalt, iron, or boron, and wherein the first free magnet is on the first electrode.

20. The system of claim 14, wherein the pSOT memory device further comprises a synthetic anti-ferromagnet (SAF) between the fixed magnet and the second electrode.

* * * * *